United States Patent
Yeh

(10) Patent No.: US 11,255,922 B2
(45) Date of Patent: Feb. 22, 2022

(54) REAL-TIME DETECTION OF HIGH-IMPEDANCE FAULTS

(71) Applicant: The Government of the United States of America, as represented by the Secretary of the Navy, Arlington, VA (US)

(72) Inventor: Hen-Geul Yeh, Cypress, CA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 57 days.

(21) Appl. No.: 16/996,960

(22) Filed: Aug. 19, 2020

(65) Prior Publication Data

US 2021/0055357 A1 Feb. 25, 2021

Related U.S. Application Data

(60) Provisional application No. 62/889,074, filed on Aug. 20, 2019.

(51) Int. Cl.
*G01R 31/58* (2020.01)
*G01R 19/165* (2006.01)
(Continued)

(52) U.S. Cl.
CPC ......... *G01R 31/58* (2020.01); *G01R 19/1659* (2013.01); *H02H 1/0007* (2013.01); *H02H 7/22* (2013.01)

(58) Field of Classification Search
CPC .......................... G01R 19/1659; G01R 31/086; G01R 31/088; G01R 31/54; G01R 31/58;
(Continued)

(56) References Cited

U.S. PATENT DOCUMENTS

| 7,865,321 B2 * | 1/2011 | Muthu-Manivannan .................... |
| | | G01R 31/52 |
| | | 702/65 |
| 2015/0247891 A1 * | 9/2015 | Maun ................... H02H 1/0092 |
| | | 324/764.01 |
| 2019/0128944 A1 * | 5/2019 | Englert ................ G01R 31/085 |

FOREIGN PATENT DOCUMENTS

KR 101350618 B1 * 2/2014

OTHER PUBLICATIONS

H. Yeh, S. Sim, R. Yinger and R. Bravo, "A comparative study of orthogonal algorithms for detecting the HIF in MDCs," 2017 IEEE Green Energy and Smart Systems Conference (IGESSC), 2017, pp. 1-7. Retrieved from the Internet: < https://ieeexplore.ieee.org/stamp/stamp.jsp?tp=&arnumber=8283456> (Year: 2017).*

(Continued)

*Primary Examiner* — Jared Fureman
*Assistant Examiner* — Nicolas Bellido
(74) *Attorney, Agent, or Firm* — Office of Naval Research; Hong-Vinh Nguyen

(57) ABSTRACT

Real-time detection of high-impedance faults in a distribution circuit is described. The real-time detection of high-impedance faults includes two steps. First, adaptive soft denoising is employed to perform a filtering process on a healthy dataset, and to determine a threshold. This reduces the rate of false alarms. Second, faulty datasets are prefiltered via adaptive soft denoising, then the denoised signals are processed via discrete wavelet transform to perform high-impedance fault detection using the threshold.

20 Claims, 11 Drawing Sheets

(51) Int. Cl.
*H02H 7/22* (2006.01)
*H02H 1/00* (2006.01)

(58) Field of Classification Search
CPC .... H02H 1/0007; H02H 1/0092; H02H 3/006; H02H 3/16; H02H 7/22; H02H 7/226
See application file for complete search history.

(56) References Cited

OTHER PUBLICATIONS

Abhisek Ukil, "Abrupt Change Detection in Power System Fault Analysis using Wavelet Transform", [Jun. 2005]. Retrieved from the Internet: <https://www.ipstconf.org/papers/Proc_IPST2005/05IPST202.pdf> (Year: 2005).*

J Liang "A wavelet multiresolution analysis approach to fault detection and classification in transmission lines" ScienceDirect [online]. sciencedirect.com [Jun. 1998] Retrieved from the Internet: < https://www.sciencedirect.com/science/article/pii/S0142061597000768> (Year: 1998).*

Adeyemi "Distribution network fault section identification and fault location using wavelet entropy and neural networks" ScienceDirect [online]. sciencedirect.com [May 2016] Retrieved from the Internet: <https://www.sciencedirect.com/science/article/pii/S1568494616302149> (Year: 2016).*

Yeh et al., "Wavelet and Denoising Techniques for Real-Time HIF Detection in 12-kV Distribution Circuits," IEEE Systems Journal, vol. 13, No. 4, Dec. 2019, 9 pages.

Yeh et al., "High impedance fault detection using orthogonal transforms," Proc. IEEE Green Energy Syst. Conf., Nov. 2014, 6 pages.

Yeh et al., "A comparative study of orthogonal transforms for detecting the HIF in MDCs," Proc. IEEE Green Energy Smart Syst. Conf., Nov. 2017, 7 pages.

Bravo et al., "12 kV high impedance fault testing," Proc. IEEE Power Energy Soc. General Meeting, Jul. 2017, 5 pages.

Yu et al., "An adaptive high and low impedance fault detection method," IEEE Trans. Power Del., vol. 9, No. 4, Oct. 1994, 10 pages.

Lien et al. "Energy variance criterion and threshold tuning scheme for high impedance fault detection," IEEE Trans. Power Del., vol. 14, No. 3, Jul. 1999, 8 pages.

Manishev et al. "Analyis of high impedance faults using fractal techniques," IEEE Trans. Power Syst., vol. 11, No. 1, Feb. 1996, 6 pages.

Sheng et al., "Decision tree-based methodology for high impedance fault detection," IEEE Trans. Power Del., vol. 9, No. 2, Apr. 2004, 4 pages.

Zamora et al., "New method for detecting low current faults in electrical distribution systems," IEEE Trans. Power Del., vol. 22, No. 4, Oct. 2007, 8 pages.

Gautam et al., "Detection of high impedance fault in power distribution systems using mathematical morphology," IEEE Trans. Power Del., vol. 28, No. 2, May 2013, 9 pages.

Ghaderi et al., "High impedance fault detection in the distribution network using the time-frequency-based algorithm," IEEE Trans. Power Del., vol. 30, No. 3, Jun. 2015, 9 pages.

Etemadi et al., "High-impedance fault detection using multi-resolution signal decomposition and adaptive neural fuzzy inference system," IET Gener., Transmiss., Distrib., vol. 2, No. 1, Jan. 2008, 9 pages.

Heydt et al., "Transient power quality problems analysed using wavelets," IEEE Trans. Power Del., vol. 12, No. 2, Apr. 1997, 8 pages.

Costa, "Boundary wavelet coefficients for real-time detection of transients induced by faults and power-quality disturbances," IEEE Trans. Power Del., vol. 29, No. 6, Dec. 2014, 14 pages.

Santos et al. "High-impedance fault identification on distribution networks," IEEE Trans. Power Del., vol. 32, No. 1, Feb. 2017, 10 pages.

Costa, "Fault-induced transient detection based on real-time analysis of the wavelet coefficient energy," IEEE Trans. Power Del., vol. 29, No. 1, Feb. 2014, 14 pages.

Wang et al., "Network-Integrated DSP-based adaptive high impedance ground fault feeder protection," Proc. IEEE Power Eng. Soc. General Meeting, Jun. 2007, 7 pages.

Madingou et al., "Fault detection and isolation in a DC microgrid using a central processing unit," Proc. IEEE Power Energy Soc. Innovative Smart Grid Tech. Conf., Feb. 2015, 5 pages.

Donoho, "De-noising by soft-thresholding," IEEE Trans. Inform. Theory, vol. 41, No. 3, May 1995, 15 pages.

Chang et al., "Adaptive wavelet thresholding for image denoising and compression," IEEE Trans. Image Process., vol. 9, No. 9, Sep. 2000, 15 pages.

Stockwell et al., "Localization of the complex spectrum: The S transform," IEEE Trans. Signal Process., vol. 44, No. 4, Apr. 1996, 4 pages.

Krishnanand et al., "A new real-time fast discrete s-transform for cross-differential protection of shunt-compensated power systems," IEEE Trans. Power Del., vol. 28, No. 1, Jan. 2013, 9 pages.

Wu et al., "Ensemble empirical mode decomposition: A noise-assisted data analysis method," AADA: Adv. Adaptive Data Anal., vol. 1, 2009, 41 pages.

Dragomiretskiy et al., "Variational mode decomposition," IEEE Trans. Signal Process., vol. 62, No. 3, Feb. 2014, 14 pages.

Bhavsar et al., "An aided information to characterize ECG signals as normal or abnormal," Proc. Int. Symp. Circuits Syst., May 2017, 4 pages.

Bhatnagar et al., "Different denoising techniques for medical images in wavelet domain," in Proc. Int. Conf. Signal Process. Commun., Dec. 2013, 5 pages.

Xiaoli et al., "Implementation of wavelet shrinkage de-noising based on DSP," in Proc. IEEE Int. Conf. Semicond. Electron., Kuala Lumpur, Malaysia, Dec. 2004, 5 pages.

* cited by examiner

REAL-TIME DETECTION OF HIGH-IMPEDANCE FAULTS

CROSS-REFERENCE TO RELATED APPLICATION

This application claims the benefits of U.S. Provisional Application No. 62/889,074 filed on Aug. 20, 2019, the entirety of which is incorporated herein by reference.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #111277-US2.

BACKGROUND

Modern electric power systems are complex and may include renewable resources. A power system may include transmission lines, substations, solar or wind generation units, and distribution lines where the consumers get their electrical power delivered to their door. Moreover, these complex power systems incorporate many devices, such as current transformers (CTs), voltage transformers (VTs), synchronous machines, series compensating capacitors, induction motors, flexible alternating current transmission system devices, etc.

One of the challenges affecting the power system, particularly the distribution circuit, is high-impedance faults (HIF), which may occur when the conductors in the distribution line break and fall to the ground or on other objects (e.g., a tree branch). HIF events are dynamic and random in time and locations. An HIF exhibits a nonlinear behavior due to the generation of low-current magnitudes that may be close to 0 A. While the HIF may not cause thermal damage to the power system equipment or interrupt power services to the consumers, it may be a threat to people and animals, as well as the environment, if direct contact is made with the down energized conductor.

HIFs are difficult to detect without making false alarms. It is very challenging to distinguish between the normal (i.e., healthy) and the abnormal (i.e., faulty with HIF) operating conditions in the distribution network since the HIFs may occur at unknown times and locations and for different reasons.

SUMMARY

Methods, systems, apparatuses, and computer program products are described herein for real-time detection of high-impedance faults in a distribution circuit. The real-time detection of high-impedance faults includes two steps. First, adaptive soft denoising is employed to perform a filtering process on a healthy dataset, and to determine a threshold. This reduces the rate of false alarms. Second, faulty datasets are prefiltered via adaptive soft denoising, then the denoised signals are processed via discrete wavelet transform to perform high-impedance fault detection using the threshold.

A method for real-time detection of high-impedance faults in a distribution circuit is described herein. The method includes obtaining an input signal from a device connected to the distribution circuit. The method further includes filtering the input signal using discrete wavelet transform via a first orthogonal wavelet to generate a denoised signal and determining a threshold having an upper bound and a lower bound. The method also includes decomposing the denoised signal using discrete wavelet transform via a second orthogonal wavelet to generate a decomposed signal; synthesizing a detail signal based on the decomposed signal; comparing the detail signal to the threshold; and based on the comparing, generating a trip or no-trip decision for a high-impedance fault detection device.

A system for real-time detection of high-impedance faults in a distribution circuit is also described herein. The system includes a signal sensor configured to obtain an input signal from the distribution circuit; a filter configured to denoise the input signal using discrete wavelet transformation via a first orthogonal wavelet to generate a denoised signal; and a threshold determiner configured to determine a threshold having an upper bound and a lower bound. The system further includes a signal analyzer configured to decompose the denoised signal using discrete wavelet transform via a second orthogonal wavelet to generate a decomposed signal; a signal synthesizer configured to synthesize a detail signal based on the decomposed signal; and a detector configured to compare the detail signal to the threshold and generate a trip or no-trip decision for a high-impedance fault detection device.

Another system is also described herein. The system comprises a processor; and a memory that stores computer program logic for execution by the processor, the computer program logic including a filter configured to denoise an input signal using discrete wavelet transformation via a first orthogonal wavelet to generate a denoised signal; a threshold determiner configured to determine a threshold having an upper bound and a lower bound; a signal analyzer configured to decompose the denoised signal using discrete wavelet transform via a second orthogonal wavelet to generate a decomposed signal; a signal synthesizer configured to synthesize a detail signal based on the decomposed signal; and a detector configured to compare the detail signal to the threshold and generate a trip or no-trip decision for a high-impedance fault detection device.

Figure 1:
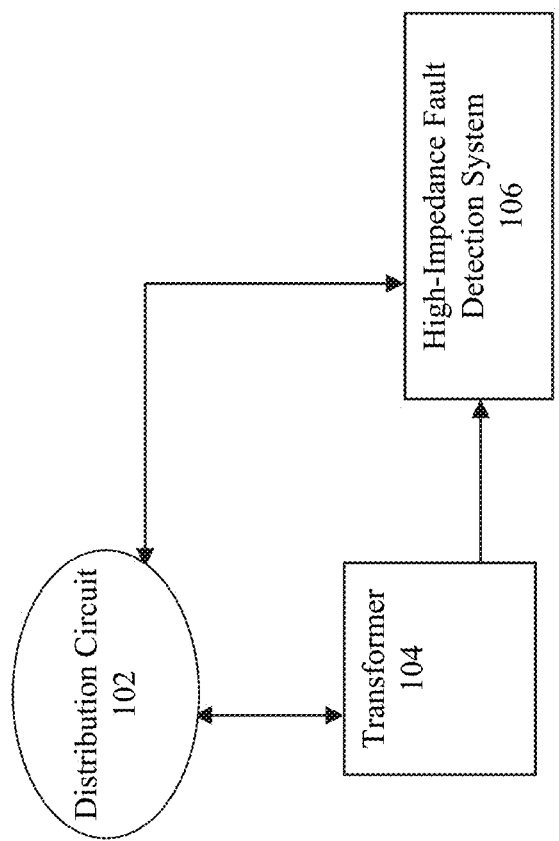
FIG. 1 is a block diagram of a power network that includes a high-impedance fault detection system.

The features and advantages of the embodiments described herein will become more apparent from the detailed description when taken in conjunction with the drawings. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Definitions

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, it is submitted that it is within the knowledge of one skilled in the art to effect such feature, structure, or characteristic in connection with other embodiments whether or not explicitly described.

In describing and claiming the disclosed embodiments, the following terminology will be used in accordance with the definition set forth below.

As used herein, the singular forms "a," "an," "the," and "said" do not preclude plural referents, unless the content clearly dictates otherwise.

As used herein, the term "and/or" includes any and all combinations of one or more of the associated listed items.

As used herein, the term "about" or "approximately" when used in conjunction with a stated numerical value or range denotes somewhat more or somewhat less than the stated value or range, to within a range of ±10% of that stated.

Terminology used herein should not be construed as being "means-plus-function" language unless the term "means" is expressly used in association therewith.

Overview

Electric power system protection methods have been studied and existing and emerging techniques may be applied to detect the existence of HIF, such as fast Fourier transform, Walsh-Hadamard transform, third harmonic current fault angle, fundamental voltage phasor, fractal technique, decision tree based method, and time domain analysis on signal superposition, etc. However, these methods have long time delays or require high computation resources, and are thus not suitable for real-time implementation. Other available HIF detection techniques include ones based on frequency-domain analysis, time-domain analysis, time-scale analysis, training based methods, or the neurofuzzy method. These techniques are not ideal either, as they require a training phase and a testing phase.

In contrast to the above techniques, wavelet transform (WT) is simple and suitable for real-time applications. In particular, a two-step technique is described herein. It combines both adaptive soft denoising and orthogonal discrete WT methods for detecting HIF. This technique can detect HIF fast and accurately with a low rate of false alarms, or none at all.

FIG. 1 is a block diagram of an electric power network 100 that includes a high-impedance fault detection system 106. System 106 may implement the HIF detection technique described herein. Power network 100 may further include a transformer 104 that is configured to provide final voltage/current transformation from distribution circuit 102, by stepping down the voltage/current used in distribution circuit 102, to the level used by the customer. Transformer 104 may also be configured to provide certain measured data to system 106 as described below. Power network 100 may include multiple transformers and HIF detection systems installed in various locations. Such locations may include high-risk ones, for example, a location that often suffers from high winds making it more susceptible to conductor breakage.

The HIF detection technique described herein rely on measured data. However, measured data from most distribution circuits are inherently multiscale (i.e., varying levels of voltage exist in various parts of the distribution circuits) in nature owing to contributions from HIF events occurring at different locations, different amplitudes, and with different localization in time and frequency. Consequently, the abnormal or transient data analysis and modeling methods that represent the measured variables at multiple scales are better suited for extracting HIF information from measured data than methods that represent the variables at a single scale. Hence, discrete wavelet transform (DWT) is a good approach to detect HIF and other events. This is due to the fact that the DWT is suitable for multiresolution with an accurate local description and decomposition of signals.

The arrival of low cost digital devices and advanced communication technology open new research areas toward solutions to detect HIF in real time. The signals received from diversely selected relay installation points along the distribution line may be employed for detecting HIF events at different locations. Orthogonal DWT algorithms are well matched to the digital computation with the digital signal processor (DSP) or similar devices, such as a custom processor or a field programmable gate array (FPGA). These processing devices are becoming essential assessment devices that enable real-time HIF detection in power systems. Given this, it is possible to implement the HIF detection technique described herein with additional or existing hardware component(s) in the power network. Moreover, such processing device may also be employed for global communication within the power network (e.g., along the transmission or distribution line) to notify the service provider or the utility company immediately after detecting the HIF event and to identify the corresponding location effectively.

The HIF detection technique described herein is developed based on test datasets from an electricity supplier. This technique includes two main steps. In step one, adaptive soft thresholding denoising is employed to perform a filtering process on a healthy dataset, and subsequently an HIF detection threshold may be selected to reduce the rate of false alarms. In step two, faulty datasets are filtered using adaptive soft denoising methods. Because this filtering process precedes the HIF detection, it may be referred to herein as a prefiltering process. Then, the denoised signal is processed via DWT to perform HIF detection. This HIF detection technique may be realized in a DSP or similar devices in real time due to the robust and simple nature of the technique.

The described HIF detection technique has the benefits of real-time robust operations as well as reliability due to the filtering process (i.e., denoising in step one). In addition, the HIF detection technique requires fewer computational resources compared to other techniques, therefore it is less burdensome to the distribution circuit. Thus, real-time detection of HIF is enabled and the performance of the distribution circuit is improved. Not only is there an increased efficiency with the described HIF detection technique, the reliability/accuracy also improves as the rate of false alarms is reduced due to the denoising step. Thus, the HIF detection achieves better results than conventional wavelet schemes that do not employ this prefiltering process.

High Impedance Fault Detection

It is generally difficult to detect HIF events without generating false alarms because it is challenging to distinguish between the healthy and faulty operating conditions in an electric power network. HIF events have a nonlinear behavior that can sometimes generate low-current magnitudes that may be close to 0 A. The table below lists typical HIF currents.

TABLE 1

HIF Currents on Different Surface Materials

| Surface | Current (mA) |
| --- | --- |
| Dry dirt | $2 \times 10^2$-$4 \times 10^2$ |
| Dry asphalt | $2 \times 10^2$ |
| Dry sand | $6 \times 10^2$ |
| Concrete (non-reinforced) | $4 \times 10^2$ |
| Wet Sand | $15 \times 10^3$ |
| Dry sod | $20 \times 10^3$ |
| Dry grass | $25 \times 10^3$ |
| Wet sod | $40 \times 10^3$ |
| Wet grass | $50 \times 10^3$ |
| Concrete (reinforced) | $75 \times 10^3$ |

Figure 2:
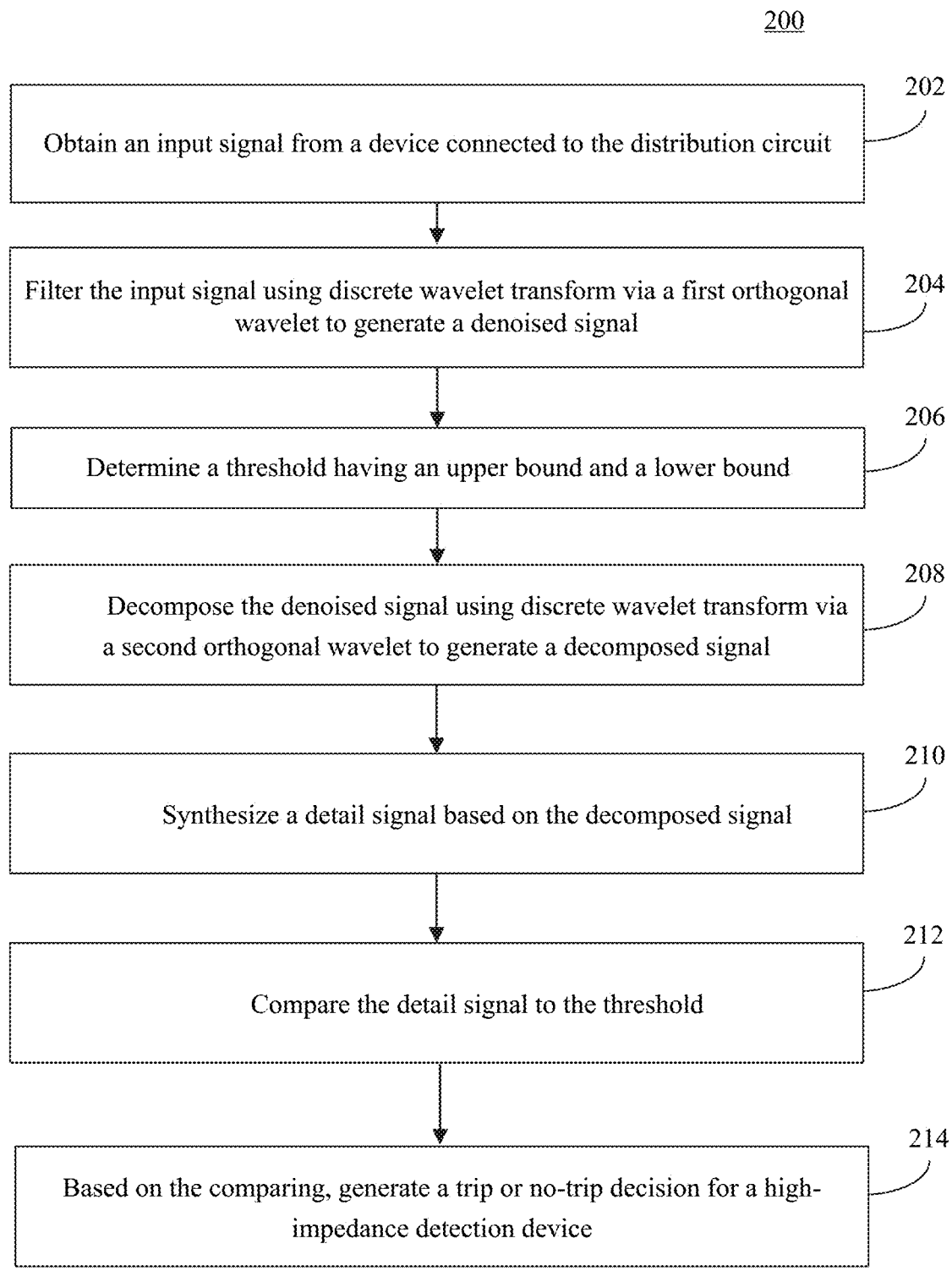
FIG. 2 is a flowchart providing a process for real-time detection of high-impedance faults in a distribution circuit.

FIG. 2 is a flowchart providing a process for real-time detection of high-impedance faults in a distribution circuit, such as distribution circuit 102 shown in FIG. 1.

Flowchart 200 begins with step 202. In step 202, an input signal is obtained from a device connected to the distribution circuit. For example, the input signal maybe measured data (e.g., a voltage and/or current signal) that is obtained from a device connected to the distribution circuit, such as transformer 104 shown in FIG. 1. The input signal may be processed in some manner to place the input signal in a format appropriate for subsequent step(s). For example, the input signal may be modified to make it suitable for an instrument/component of the device and/or system that implements flowchart 200. Alternatively, the input signal may already be in an appropriate format and therefore no further processing is needed. The input signal may include data from a healthy dataset or a faulty dataset.

In step 204, the input signal is filtered using discrete wavelet transform via a first orthogonal wavelet to generate a denoised signal. For example, the input signal may be filtered to reduce or remove the noise component in the input signal. The DWT is suitable for this application, although other transforms may be used, such as spline wavelet transforms, biorthogonal wavelet transforms, Coif and other Daubechies transforms. Any wavelet in the Daubechies family may be utilized as the first orthogonal wavelet. In an embodiment, Daubechies 6 (db6) may be utilized as the first orthogonal wavelet.

Orthogonal DWT is a linear transform that performs an inner product of an original signal with an orthogonal wavelet. The DWT of a given signal is called the wavelet coefficients of the original signal. With time and scale indexes, these wavelet coefficients completely describe the original signal and may be used for analysis, description, approximation, and filtering processes.

Figure 3:
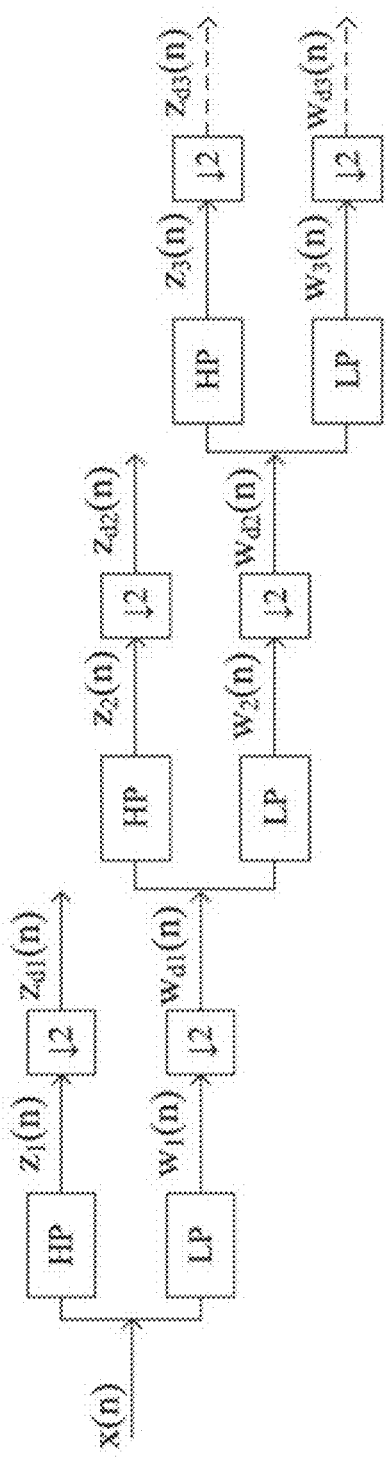
FIG. 3 is a block diagram of a multiresolution analysis from level 1 to level 3 discrete wavelet transform structure for the analysis of a signal.
Figure 4:
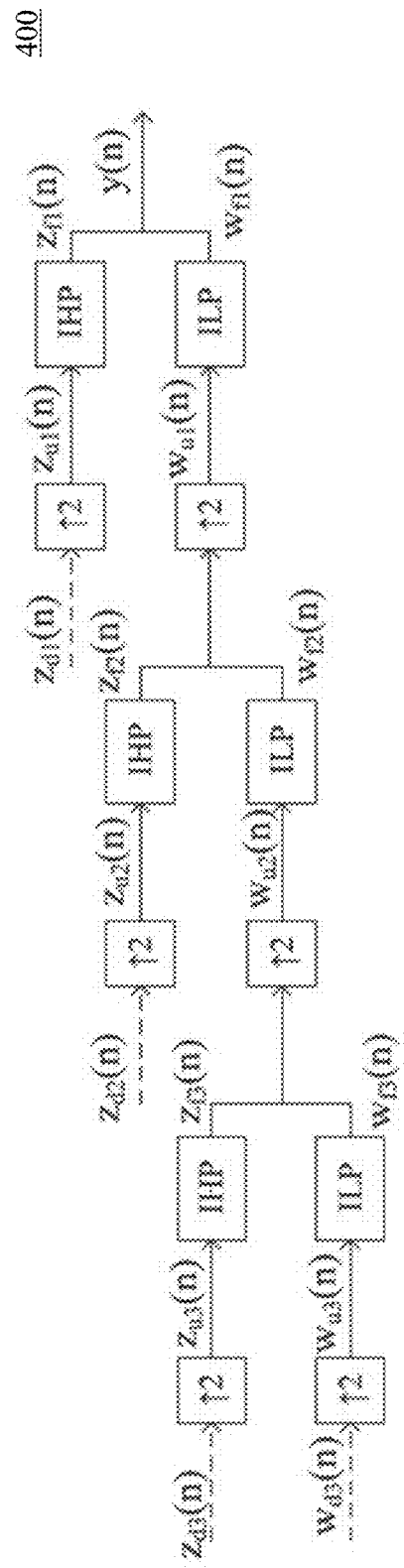
FIG. 4 is a block diagram of a multiresolution analysis from level 1 to level 3 discrete wavelet transform structure for the synthesis of a signal.

FIG. 3 is a block diagram of a multiresolution analysis from level 1 to level 3 discrete wavelet transform structure for the analysis of a signal. FIG. 4 is a block diagram of a multiresolution analysis from level 1 to level 3 discrete wavelet transform structure for the synthesis of a signal. The DWT families may be shown in different levels of resolution (i.e., fewer or more than the three shown in FIGS. 3 and 4), known as the multiresolution analysis (MRA). The MRA analyzes the signal at different frequencies with different resolutions. MRA may give good time resolution and poor frequency resolution at high frequencies and poor time resolution and good frequency resolution at low frequencies. This approach is useful when the signal of interest has high frequency components for short durations and low frequency components for long durations.

FIG. 3 depicts the analysis of an input, in which an original signal x(n) is simultaneously decomposed into two components: a detail signal $z_j(n)$ and an approximation signal $w_j(n)$ through a high-pass (HP) filter and a low-pass (LP) filter at level j. At each level, the outputs give the detail coefficients, from the HP filter, and approximation coefficients, from the LP filter. The two HP and LP filters may be related to one another (e.g., quadrature mirror filter). Through this process, half the frequencies of the original signal is removed and half the samples may be discarded according to Nyquist's rule. The filter output of the LP filter may be down sampled by 2 and further processed via another LP and HP filter pair, with half the cut-off frequency of the previous level. This decomposition halves the time resolution since only half of each filter output characterizes the signal. However, each output has half the frequency band of the original signal, thus the frequency resolution is doubled. The decomposition of the original signal may be repeated to further increase the frequency resolution and produce the approximation coefficients. The resulting structure is a filter bank—a binary tree with nodes representing a sub-space with a different time-frequency localization.

Thus, each resolution's output is decimated by a factor of 2 and denoted as $z_{dj}(n)$ or $w_{dj}(n)$ at level j. The MRA detects the patterns or signatures of HIF events that may not be visible in the raw data (e.g., the original signal). FIG. 3 shows the first three levels of the MRA with DWT, and this decomposition process may be repeated as long as the length of the LP filtered output signal can be divided by 2. The filtered and down sampled output sequences may be expressed as follows.

$$w_{dj}(n) = \sum_m h(m) w_{d(j-1)}(2n-m) \quad (1.1)$$

$$z_{dj}(n) = \sum_m g(m) z_{d(j-1)}(2n-m) \quad (1.1)$$

where $w_{dj}(n)$ is the approximation coefficients (i.e., the output of the LP filter, h(n), down sampled), $z_{dj}(n)$ is the detail coefficients (i.e., the output of the HP filter, g(n), down sampled), and j is the index of the level of the decomposition. Note that at the initial level 0, $w_{d0}(n) = z_{d0}(n) = x(n)$.

FIG. 4 depicts the synthesis of a signal. The signal may be synthesized by starting with a very low resolution signal and successively adding on details to generate higher resolution versions, and ending with a complete synthesis of the original signal at the finest resolution. Similar to the analysis of the signal as shown in FIG. 3, the reversed operations may be performed for the synthesis of the signal. After inverse LP filtering via $\bar{h}(n)$ and inverse LP filtering via $\bar{g}(n)$, the output sequences $w_{fj}(n)$ and $z_{fj}(n)$ are added and up sampled by a factor of 2. Synthesis operations may be expressed as follows.

$$w_{u(j-1)}(n) = \sum_m \left\{ w_{uj}\left(\frac{n-m}{2}\right) \bar{h}(m) + z_{uj}\left(\frac{n-m}{2}\right) \bar{g}(m) \right\} \quad (2.1)$$

where $w_{uj}\left(\frac{n}{2}\right) = z_{uj}\left(\frac{n}{2}\right) = 0$, if $\frac{n}{2} \neq \text{int}$ $$z_{fj}(n) = \sum_m z_{dj}\left(\frac{n-m}{2}\right) \bar{g}(m) \quad (2.2.1)$$

$$w_{fj}(n) = \sum_m w_{dj}\left(\frac{n-m}{2}\right) \bar{h}(m) \quad (2.2.2)$$

where $z_{dj}\left(\frac{n}{2}\right) = w_{dj}\left(\frac{n}{2}\right) = 0$, if $\frac{n}{2} \neq \text{int}$ $$y(n) = w_{f1}(n) + z_{f1}(n) \quad (2.3)$$

As a result, the original input signal x(n) may be fully recovered at the final output of the synthesis process, i.e., y(n)=x(n).

Denoising may be accomplished via several denoising methods, such as adaptive denoising by soft-thresholding method, S-transform, fast discrete Stockwell transform (FDST), ensemble empirical mode decomposition (EEMD), variational mode decomposition (VMD), wavelets-based applications, and implementation on DSP. Each method has its own advantages and disadvantages. For example, both S-transform and FDST have a relatively high computational cost. Both EEMD and VMD may cause significant delay in real-time operation due to the time needed to get ensemble average or the minimization process in searching the estimated bandwidth of all modes in the frequency domain. On the other hand, the adaptive soft-thresholding techniques have been applied in many areas as the denoising process and is employed in embodiments due to its optimality and simplicity, and may be easily implemented in real-time without time delay. Examples described herein employ the adaptive soft-thresholding denoising techniques, however, other denoising mechanisms (e.g., S-transform, FDST, EEMD, VMD, etc.) may also be utilized in implementing the HIF detection technique since each application may be different with different requirements and resources.

Since the wavelet detail coefficients may be comprised of the desired information component as well as the noise component (e.g., line switching, connection and disconnection of large loads, etc.), a denoising process to filter out noise is beneficial in order to minimize the rate of false alarms. For example, a contaminated signal f may be the sum of a transmitted signal s plus a noise signal n. If the energy of the original s is effectively captured, to a high percentage, by transform values whose magnitudes are all greater than a threshold $T_s > 0$; and if the noise signal's transform values all have magnitudes which lie below a noise threshold $T_n$ where $T_n < T_s$, then the noise in f may be removed by thresholding its transform. Accordingly, all values of its transform whose magnitudes lie below the noise threshold $T_n$ may be set equal to 0 and an inverse transform may be performed, providing a good approximation of f.

Thus, the denoising process is simple to implement and may be adaptive to any subband since it depends on the data-driven estimation of each parameter. The adaptive soft-thresholding algorithm is as follows.

$$z_{dj} = \begin{cases} 0 & |z_{dj}| < \alpha_j \\ \text{sgn}(z_{dj})(|z_{dj}| - \alpha_j) & |z_{dj}| \geq \alpha_j \end{cases} \quad (3)$$

where $z_{dj}$ is the detail coefficients of the wavelet in level j. $\alpha_j$ is the data-driven estimate and is an adaptive value at each different level based on different subband characteristics, $\alpha_j$ may be obtained from equation (4) below even when the noise level is unknown.

$$\alpha_j = \frac{\text{median}|z_{dj}|\sqrt{2\ln(N_j)}}{0.6745} \quad (4)$$

where median $|z_{dj}|$ will return a rough estimation of the standard deviation of the detail coefficients $z_{dj}$. $N_j$ is the total length of the detail plus the approximation coefficients at level j.

In an embodiment, the input signal may be captured quite effectively by relatively few transform values whose magnitudes lie above a denoising threshold, which may be dynamically changed and may be based on historical or measured (i.e., real-time) data. This denoising threshold may include an upper bound and a lower bound, and all transform values lying between the upper and lower bounds may be set equal to 0, thereby producing a thresholded transform, which is a close match to the transform of the original signal. Consequently, after performing an inverse transform on the thresholded signal, a denoised signal may be obtained that is a good approximation to the original input signal. Accordingly, the denoising filtering process is effective because the transform is able to compress the energy of the original input signal into a few high-energy values, and the noise is transformed into low-energy values, which may be eliminated by thresholding.

In an embodiment, the input signal maybe filtered via MRA with DWT db6 using the adaptive soft-thresholding process (i.e., equation (3)). That is, $z_{dj}(n)$ is a denoised version of the input signal x(n), and is obtained by thresholding the wavelet coefficients at level j. The soft thresholding $\alpha_j$ is an adaptive estimated value at each different level based on different subband signals. It is applied to the db6 wavelet decomposition to remove the signal component generated by line switching and load switching. In other words, it is a filtering process to remove the nonfault events. Hence, it minimizes the possibility of making false alarms when applied to the distribution circuit. Once db6 is applied to the original input signal, most of the noise is removed and the denoised signal appears smoother than the original.

The adaptive data-driven denoising via soft thresholding techniques based on db6 level 3 of decomposition is chosen over hard thresholding techniques for several reasons. First, the soft thresholding technique can achieve near-optimal minimax rate over the large range of Besov spaces. Second, the optimal soft thresholding estimator yields a smaller risk than the optimal hard threshold estimator. Hence, soft thresholding is a practical method that yields a smoother signal for detection than the hard thresholding technique.

Referring back to FIG. 2, in step 206, a threshold having an upper bound and a lower bound is determined. For example, the threshold may be determined using the adaptive soft-thresholding technique described herein. The threshold may be dynamically changed and may be based on historical or measured (i.e., real-time) data. In an embodiment, the threshold may be based on a healthy dataset without high-impedance faults during normal operation of the distribution circuit. Thus, when faulty datasets are processed, this threshold may be readily available to enable HIF detection on the faulty datasets. The threshold may also be based on other factors (e.g., locations, weather patterns, changes to the power network, and one or more datasets) and may be dynamically changed based on any number of factors. The threshold may be determined in any known way, as a heuristic threshold derived by trial and error, with a set of rules, etc.

In step 208, the denoised signal is decomposed using discrete wavelet transform via a second orthogonal wavelet to generate a decomposed signal. In an embodiment, the second orthogonal wavelet may comprise a Daubechies wavelet, such as Daubechies 2 (db2), although other wavelets may be utilized. The discrete wavelet transform may be implemented using multiresolution analysis as shown in FIG. 3.

In step 210, a detail signal is synthesized based on the decomposed signal. For example, the detail signal may be synthesized based on the decomposed signal produced in step 208 by using multiresolution analysis as shown in FIG. 4.

In step 212, the detail signal is compared to the threshold. In an embodiment, the detail signal generated in step 210 may be compared to the threshold generated in step 206. In order to accurately detect the HIF, the HIF detection technique needs to be sensitive to an abrupt change in the signal's polarity when the signal amplitude is higher or lower than the HIF detection threshold. By using the heuristic threshold obtained in the pre-HIF analysis (e.g., in step 206), the following HIF detection criteria may be utilized. If one or more output bin values of the detail reconstruction output signal are higher or lower than the predetermined heuristic threshold with polarity changes in two or more consecutive windows, then a HIF exists and is detected. Otherwise, no HIF is detected, indicating healthy, normal operating condition. The described HIF technique focuses on HIF rather than the fault events caused by other disturbances. Most disturbances (e.g., line switching, connection and disconnection of large loads, etc.) create a large current change up or down, while HIF only causes very small current changes (approximately 100 mA). Although these disturbances may produce a similar polarity change to the HIF, they should be removed in the denoising process via DWT db6 (or similar wavelets) or detected by other hardware relays and/or circuit breakers within the distribution circuit before the final stage HIF detection.

In step 214, based on the comparing, a trip or no-trip decision for a high-impedance detection device is generated. For example, a trip decision may be generated indicating detection of a high-impedance fault when (1) the detail signal is higher than the upper bound of the threshold in a first moving time window, and the detail signal is lower than the lower bound of the threshold in a second consecutive moving time window, or when (2) the detail signal is lower than the lower bound of the threshold in a first moving time window and the detail signal is higher than the upper bound of the threshold in the second consecutive moving time window. In other words, HIF detection may be performed with a minimum of two consecutive time frames or moving windows. An HIF event may be determined from the two frames if there is at least one value of the detail signal that is above or below the threshold in one frame and at least one value of the detail signal that is respectively below or above the threshold in the next frame. That is, a trigger for an HIF event is when there is a polarity change from a negative value to a positive value or vice versa detected from one frame to the next. When an HIF event is triggered, a trip decision may be generated for the high-impedance fault detection device.

In contrast, a no-trip decision, indicating no detection of a high-impedance fault, is generated when the detail signal is within the upper bound and the lower bound of the threshold. That is, when there is no value that falls below or above the threshold band, this indicates no HIF event occurred, and therefore a no-trip decision may be triggered.

A moving window may be employed to detect the HIF in the time domain. The window length may be selected to obtain a detection rate with a desired false alarm rate. That is, the window length may strike a balance of adequate data to perform HIF detection against the rate of false alarm. Such window length may depend on the data and instrumentation (e.g., processing unit) implemented, but may be a length of 8, 16, 32, etc. That is, the window length may be chosen for efficient computation of the processing unit utilized. For example, if the input is a 60 Hz signal with a sampling frequency $f_s$ of 960 Hz, the frequency ratio would be 60/960=1/16. Therefore, a window length of 16 would be adequate to cover one complete signal cycle in each frame of the moving window.

Figure 5:
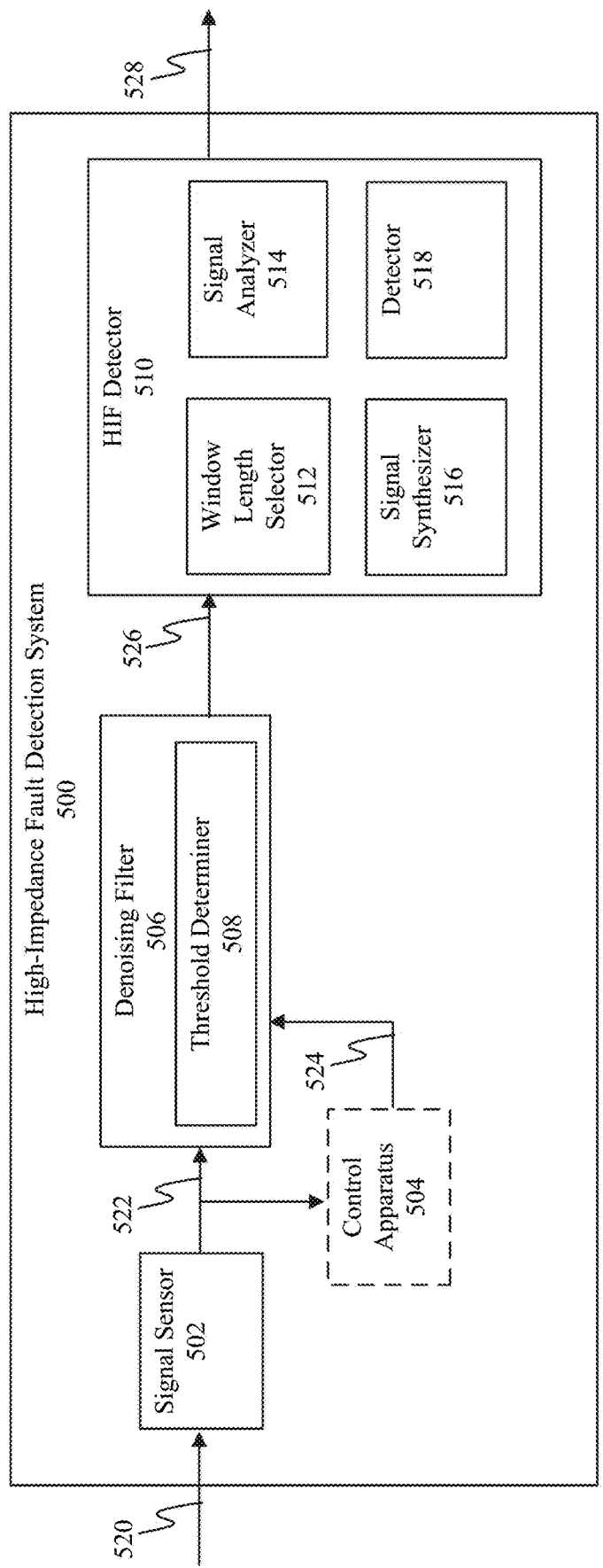
FIG. 5 is a block diagram of a high-impedance fault detection system.

The process shown in FIG. 2 may be implemented in various ways. FIG. 5 is a block diagram of a high-impedance fault detection device that may implement the process of FIG. 2. FIG. 5 is a block diagram of a high-impedance fault detection system 500, which may be implemented as HIF detection system 106 (shown in FIG. 1). System 500 includes a signal sensor 502, an optional control apparatus 504, a de-noising filter 506 that may include a threshold determiner 508, and a high-impedance fault detector 510. In embodiments, the components of system 500 may be separately implemented or they may be combined. System 500 may be implemented in a power network, particularly, a distribution circuit to perform high-impedance fault detection. For example, system 500 may be placed in areas where the risk of HIF is high (e.g., certain geographic locations or areas with special weather patterns or where fires are known to occur). System 500 may be a standalone device, or it may be implemented with other devices and/or systems in the power network. Multiples of system 500 may be located in the power network as measured data may differ at different locations. Some or all of system 500 may be implemented with one or more digital signal processor, a field programmable gate array, or custom hardware. For example, a processing unit that can compute 500 or more computations within one millisecond to enable real-time detection of HIF may be utilized for system 500.

Signal sensor 502 is configured to obtain an input signal 520 from a distribution circuit, such as distribution circuit 102 shown in FIG. 1. For example, signal sensor 502 may obtain input signal 520 from a voltage and/or a current transformer, such as transformer 104 shown in FIG. 1. In an embodiment, input signal 520 may be a current and/or a voltage signal. The output of signal sensor 502 may be signal 522, which may be the same as input signal 520 or some version of input signal 520 (e.g., sampled, discretized, normalized, etc.). In an embodiment, signal sensor 502 may implement step 202 of FIG. 2.

Control apparatus 504 is configured to place signal 522 in an appropriate format for instrumentation processing prior to filtering the input signal. For example, control apparatus may process the raw input data in order to enable other instruments or components to consume such data, thereby making the input signal instrument appropriate. For instance, the power network may be configured to provide data in a first format, and the component(s) of system 500 may be configured to accept input data in a second format that is different from the first format. In this case, control apparatus 504 may be utilized to process or modify signal 522 to generate controlled signal 524 that is in a suitable format for subsequent component(s) of system 500. In an embodiment, control apparatus 504 may reduce a current and/or voltage amplitude level of the input signal. In embodiments, control apparatus 504 may not be needed, especially if input signal 520 is already in a suitable format. Thus, control apparatus 504 is shown in FIG. 5 as a block with dashed lines making it an optional component.

De-noising filter 506 is configured to denoise signal 522 or controlled signal 526 using discrete wavelet transformation via a first orthogonal wavelet to generate a denoised signal 524. DWT may be performed with any transform in the Daubechies family, such as Daubechies 6 (db6), or other transforms, as described above in reference to step 204 of FIG. 2. In an embodiment, de-noising filter 506 may include a filter bank, comprising of low pass and high pass filters, e.g., having a structure as shown in FIGS. 3 and 4.

Threshold determiner 508 is configured to determine a threshold having an upper bound and a lower bound. For example, threshold determiner 508 may be implemented with the adaptive soft-thresholding technique described herein, although other denoising techniques may also be utilized. The threshold generated by threshold determiner 508 may be based on a healthy dataset without a high-impedance fault during normal operation of the distribution circuit. The generated threshold may be passed to HIF detector 510 along with the denoised signal as signal 526. In an embodiment, threshold determiner 508 may implement step 206 of FIG. 2.

HIF detector 510 is configured to receive signal 528 and detect any high-impedance fault events contained in original input signal 520. HIF detector 510 may include window length selector 512 that is configured to select a window length for the input signal. That is, window length selector 512 may have an input that is one or more of input signal 520, signal 522, signal 524, and signal 526 as well as data about the different components of HIF detection system 500. The window length may be selected to obtain a detection rate with a desired false alarm rate as described above in reference to FIG. 2.

Signal analyzer 514 of HIF detector 510 is configured to decompose the denoised signal using discrete wavelet transform via a second orthogonal wavelet to generate a decomposed signal. For example, signal analyzer 514 may employ multiresolution analysis to synthesize the detail signal. The second orthogonal wavelet may be any wavelet in the Daubechies family, such as Daubechies 2 (db2). Signal analyzer 514 may implement step 208 of FIG. 2 in an embodiment.

Signal synthesizer 516 of HIF detector 510 is configured to synthesize a detail signal based on the decomposed signal. For example, signal synthesizer 516 may employ multiresolution analysis to synthesize the detail signal. In an embodiment, signal synthesizer 516 may implement step 210 of FIG. 2.

Detector 518 is configured to compare the synthesized signal to the threshold provided by threshold determiner 508 and generate a trip or no-trip decision for HIF detection system 500. That is, detector 518 may be configured to generate a trip decision indicating detection of a high-impedance fault when a detail signal is higher than the upper bound of the threshold in a first moving time window, and the detail signal is lower than the lower bound of the threshold in a second consecutive time window or the detail signal is lower than the lower bound of the threshold in a first moving time window, and the detail signal is higher than the higher bound of the threshold in a second consecutive moving time window. Detector 518 may further be configured to generate a no-trip decision indicating no detection of a high-impedance fault when the detail signal is within the upper bound and the lower bound of the threshold. HIF detector 510 may provide an output 528 (trip or no-trip decision) to HIF detection system 500 and/or any other device(s) or system(s). For example, output 528 may be provided to a central command station of the power network to notify the utility provider that an HIF event has been detected and/or to solicit remedial action(s). In an embodiment, detector 518 may implement steps 212 and 214 of FIG. 2.

As an example, de-noising filter 506 and HIF detector 510 may include HP and LP filters, for denoising and HIF detection, described in reference to FIGS. 3-4, and these may be implemented with a 16-bit fixed-point DSP (e.g., TMS320C5514 at 100 MHz clock rate). The typical power consumption may be 0.22 mW/MHz. Thus, for the HIF detection technique, the total execution time required is about 5 microseconds (i.e., corresponding to approximately 500 multiplications, additions, and logical operations). The HIF detection technique may employ a 16-point moving window, and a db6 level 3 (432 multiplications and additions requiring 4.32 microseconds) for denoising via adaptive soft thresholding (20 logical operations requiring 0.2 microseconds) and db2 level 1 (48 multiplications and additions requiring 0.48 microseconds) for the HIF detection per current sample. The required on-chip program size and data size may be less than 1 k and 16-bit memory in read-only memory and random access memory, respectively.

Furthermore, in examples, the sampling period may be 1.04 milliseconds (960 Hz sampling frequency) or 200 microseconds (5010 Hz sampling frequency). In both of these examples, the sampling period is much larger than 5 microseconds, the required execution time for the HIF real-time detection. Therefore, a low-cost DSP chip may be employed for both real-time HIF detection and other real-time tasks, such as power line communications.

Accordingly, the HIF detection technique described herein may detect HIF events based on the wavelet's localization property from a finer resolution level of signal decomposition technique. Thus, this technique offers an effective way to detect HIF without generating false alarms, and can thus prevent human hazard in real time, when an energized conductor is down. Additionally, this technique provides more freedom and flexibility for handling different HIF cases. The main advantages of the wavelet transform are MRA and better event localization. Hence, this two-step HIF detection technique, combining db6 adaptive denoising and db2 moving window detection processes, is a useful tool for analyzing and localizing the behavior of the transient current signal generated by an HIF event in a distribution circuit.

Examples Based on Distribution Circuit Datasets

Three datasets are described herein for illustration purposes. These datasets include data from a 12-kilovolt (kV) distribution circuit. A power network generally has two operating states, a healthy or normal state and a faulty or abnormal state. One normal and healthy dataset is used as a baseline to select the HIF detection threshold and two faulty sets (with HIF events) are used for HIF detection. When the HIF detection threshold is applied to the healthy dataset in normal operation, no HIF events are detected nor are false alarms generated. When the HIF threshold is applied to the faulty datasets, HIF event(s) are detected.

Pre-HIF Analysis for Denoising and Determining the HIF Test Heuristic Threshold

A pre-HIF analysis is performed for selecting a preprocessing technique and determining the HIF test heuristic threshold with the healthy dataset in normal operation as a baseline. The two faulty datasets are employed for verifying the proposed techniques by using the heuristic threshold for detecting HIF existence.

Figure 6:
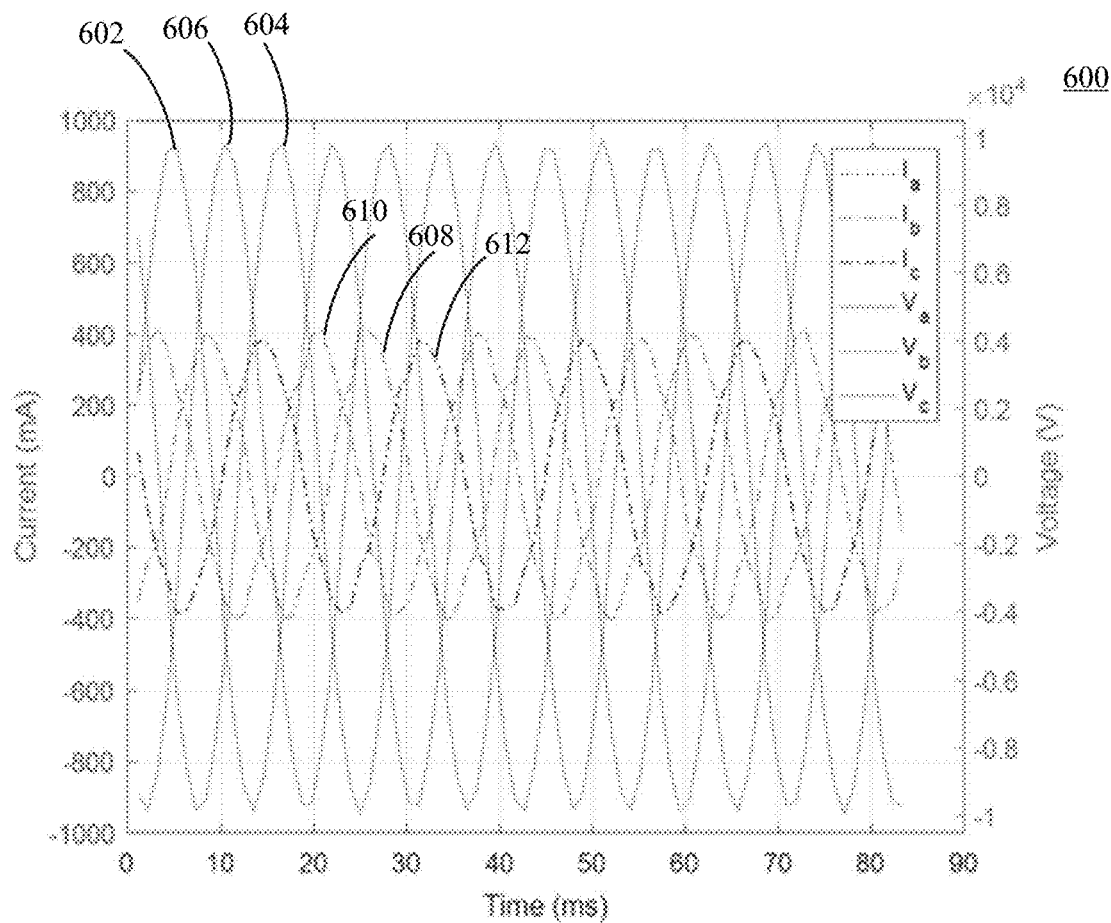
FIG. 6 is a plot of voltage and current signals in a normal operating condition without HIF faults.

FIG. 6 is a plot of voltage and current signals in a normal condition without any HIF fault. In FIG. 6, the three phases of a voltage signal $x(n)_{Va}$, $x(n)_{Vb}$, and $x(n)_{Vc}$ are respectively labeled as 602, 604 and 606 and the three phases of a current signal $x(n)_{Ia}$, $x(n)_{Ib}$ and $x(n)_{Ic}$ are respectively labeled as 608, 610 and 612. As shown in FIG. 6, the current signal in each phase is approximately 400 mA. This is due to the fact that all lines are connected to monitoring devices. Thus, for this dataset, the baseline reference, i.e., the HIF heuristic threshold, may be set at ±22 mA. This threshold value is selected such that all prefiltered signals stay inside the boundary of ±22 mA. It may be used to distinguish prefiltered signals between healthy and faulty conditions without generating false alarms.

Even in the normal operating condition, the voltage and current signals received from voltage and current transformers may be contaminated by noise, which might trigger false alarms by the detection device. In order to accurately detect the HIF and minimize the false alarms, a preprocessing technique may be applied to the healthy dataset to remove noise and to select the HIF heuristic detection threshold. This heuristic threshold may later be applied to faulty datasets to detect HIF.

With the healthy dataset, if one or more output bin values (e.g., output 528 shown in FIG. 5) of the detail reconstruction output are higher than the upper bound or lower than the lower bound of the predetermined heuristic threshold, then a false alarm is triggered.

Four cases for determining the heuristic threshold are described herein: without prefiltering, prefiltering with a band stop filter (BSF), prefiltering with a median filter (MF), and prefiltering with the db6 denoising technique.

In the first case, without filtering, a dataset of 80 data points with a sampling frequency of 960 Hz is used. In each signal cycle, there are 16 data points to represent the 60 Hz signal. By choosing 16 as the window length, there are 65 moving windows over the 80 data samples. While the window takes the newest data sample whenever it is available (e.g., from a current/voltage transformer) in real time, the oldest data is dropped from that window. Thus, the first set of data is $[x_0, x_1, x_2, \ldots, x_{15}]$ in frame number 1; and the second set of data is $[x_1, x_2, x_3, \ldots x_{16}]$ in frame number 2, and so on. As the baseline, current signal $x_{Ia}$ is selected as the input and is processed by the analysis and synthesis of FIGS. 3 and 4 via db2 DWT level operation. Current signal $x_{Ia}$ is selected as a non-limiting example, other current signals (e.g., $x_{Ib}$ or $x_{Ic}$) may be used and would yield the same results. The corresponding detail reconstruction signal, $z_{f1}(n)$, frame by frame, is used to detect the HIF as shown in FIG. 7.

Figure 7:
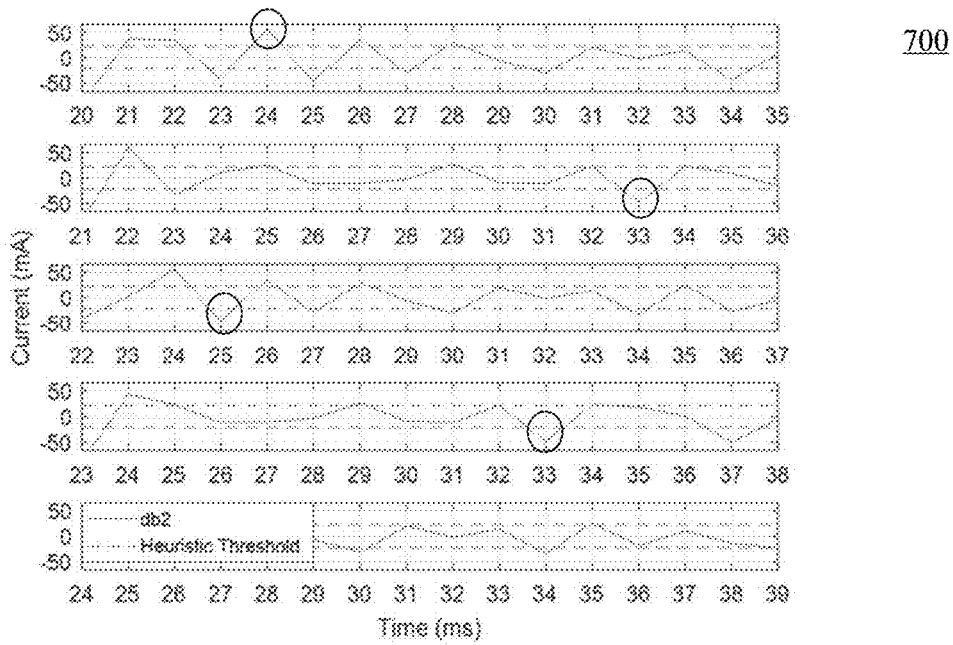
FIG. 7 is a plot of a detail reconstruction signal without filtering.

FIG. 7 is a plot of a detail reconstruction signal without filtering. Here, the heuristic threshold is set to 22 mA for the upper bound and −22 mA for the lower bound. When a bin value of the $z_{f1}(n)$ signal is higher than the upper bound or is lower than the lower bound of the threshold, it indicates that there is a false alarm since this dataset set is a healthy one. As shown in FIG. 7, there are multiple false alarms from the top frame to the bottom frame. Some of the false alarms are highlighted with circles. Hence, a prefiltering process is needed to avoid false alarms.

The second case includes prefiltering with a BSF. The BSF centered at 60 Hz with a stopband bandwidth of 0.1 Hz is employed. The purpose of prefiltering is to remove the 60 Hz fundamental component of the signal before the db2 DWT is utilized for level 1 analysis and synthesis for detecting the HIF. After applying the BSF to the current signals $x(n)_{Ia}$, $x(n)_{Ib}$, and $x(n)_{Ic}$, the fundamental 60 Hz frequency component is completely removed and renamed as $x(n)_{Ia0002B}$, $x(n)_{Ib0002B}$ and $x(n)_{Ic0002B}$ as shown in FIG. 8.

Figure 8:
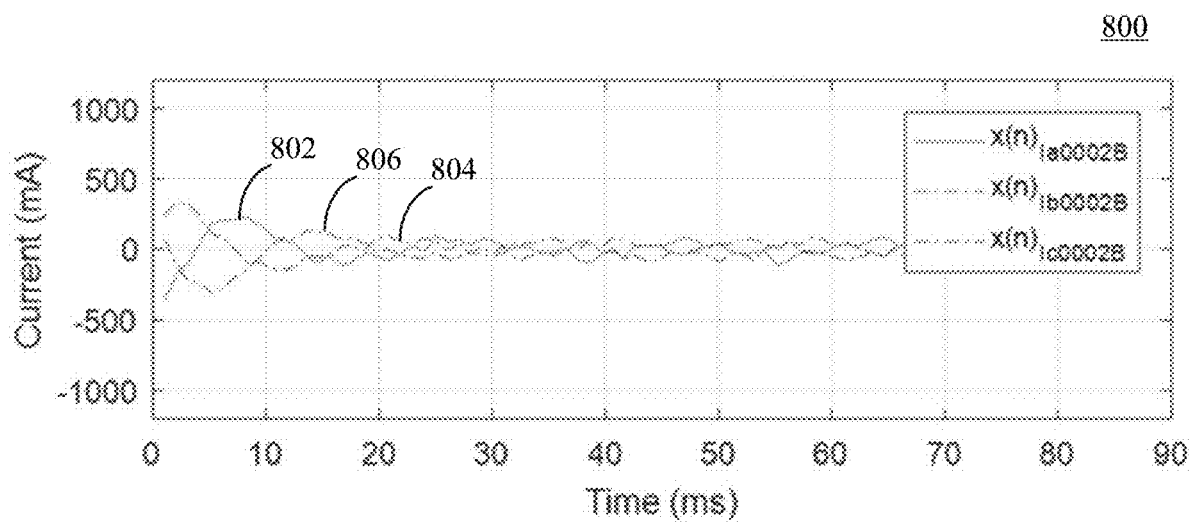
FIG. 8 is a plot of current signals without the 60 Hz fundamental frequency.

FIG. 8 is a plot of current signals without the 60 Hz fundamental frequency. The current signals $x(n)_{Ia0002B}$, $x(n)_{Ib0002B}$ and $x(n)_{Ic0002B}$ are respectively labeled as 802, 804 and 806 in FIG. 8. The BSF does not remove the noise component outside the stopband of the BSF. Thus, the noise contamination remains. The graph of the bin value of the $z_{f1}(n)$ signal sequence of this case is shown in FIG. 9.

Figure 9:
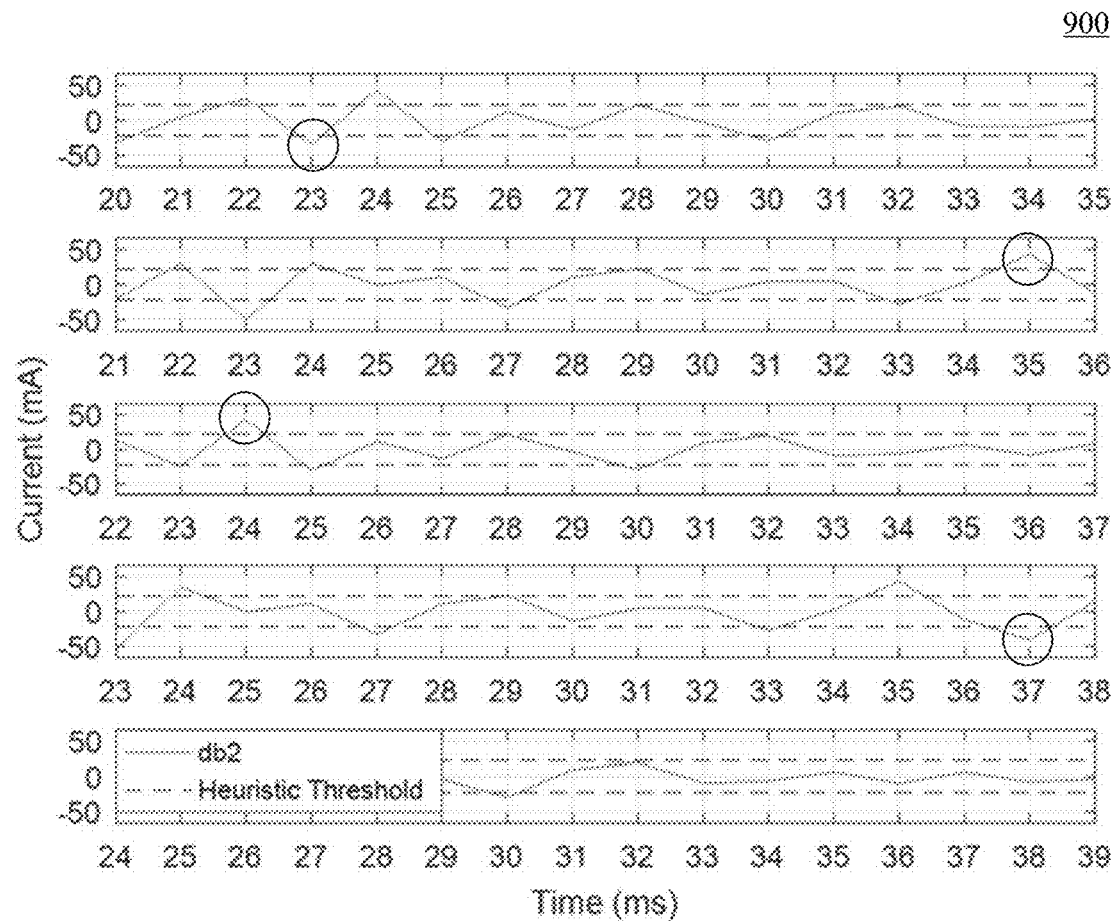
FIG. 9 is a plot of a detail reconstruction signal with band stop filtering.

FIG. 9 is a plot of a detail reconstruction signal with band stop prefiltering. Similar to the first case, many false alarms may be seen after application of db2 DWT level 1 to detect HIF with the threshold of ±22 mA. For illustration purposes, some of the false alarms are highlighted in circles in FIG. 9.

The third case includes prefiltering with a median filter (MF). The MF is for removing the noise to enable reduction of false reading in real-time detection of HIF. The current signals after median filtering are renamed as $x(n)_{Ia0002M}$, $x(n)_{Ib0002M}$ and $x(n)_{Ic0002M}$ as shown in FIG. 10.

Figure 10:
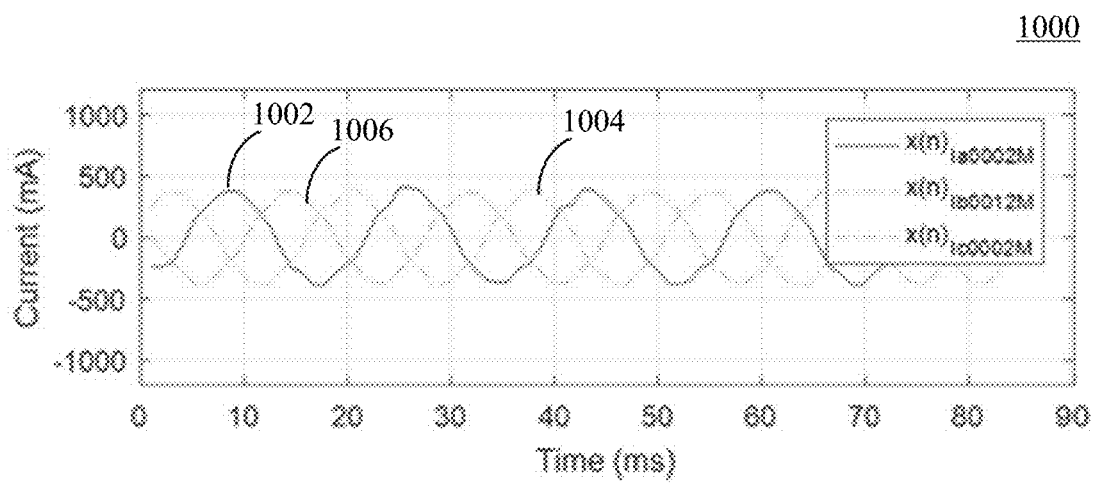
FIG. 10 is a plot of current signals after a median filtering process is applied.

FIG. 10 is a plot of current signals after median filtering is applied to the original signals (as shown in FIG. 6). The current signals $x(n)_{Ia0002M}$, $x(n)_{Ib0002M}$ and $x(n)_{Ic0002M}$ are respectively labeled as 1002, 1004 and 1006 in FIG. 10. The filtered signals are much cleaner than the original signals as shown in FIG. 6.

Figure 11:
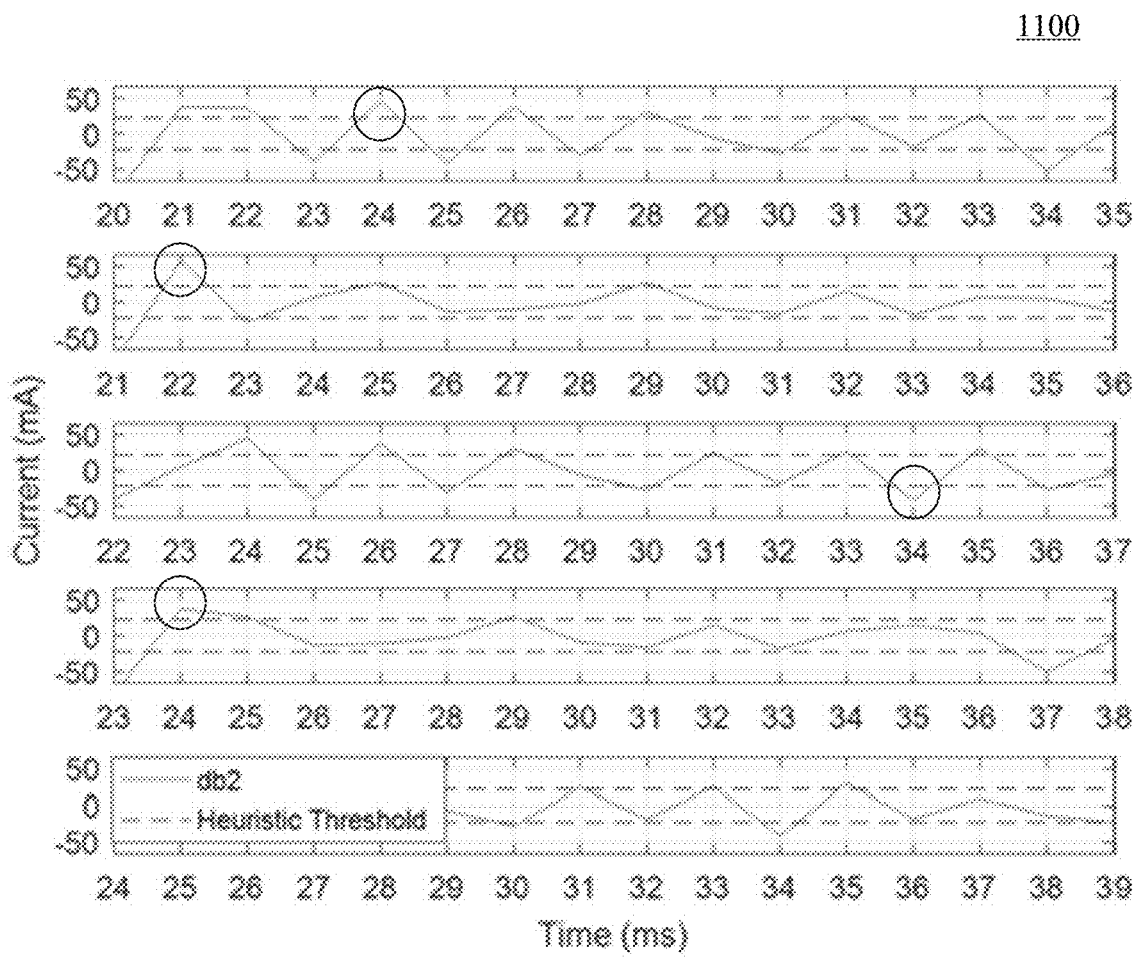
FIG. 11 is a plot of a detail reconstruction signal after median filtering.

FIG. 11 is a plot of a detail reconstruction signal after median prefiltering. The graph of the bin value of the $z_{f1}(n)$ signal sequence of this case is shown in FIG. 11. Similar to the first and second cases, many false alarms may be seen after application of db2 DWT level 1 to detect HIF with the threshold of ±22 mA. Although some noise has been removed, the residual noise component after MF still triggers false alarm readings frame by frame, some of which are highlighted in circles in FIG. 11.

The fourth case includes prefiltering with the db6 denoising technique. For a better understanding of the nature of HIF occurrence in the 12 kV distribution circuit when a conductor falls down and lands on high impedance materials, the wavelet db6 denoising technique is employed to remove the noise component before applying the db2 for real-time HIF detection.

Figure 12:
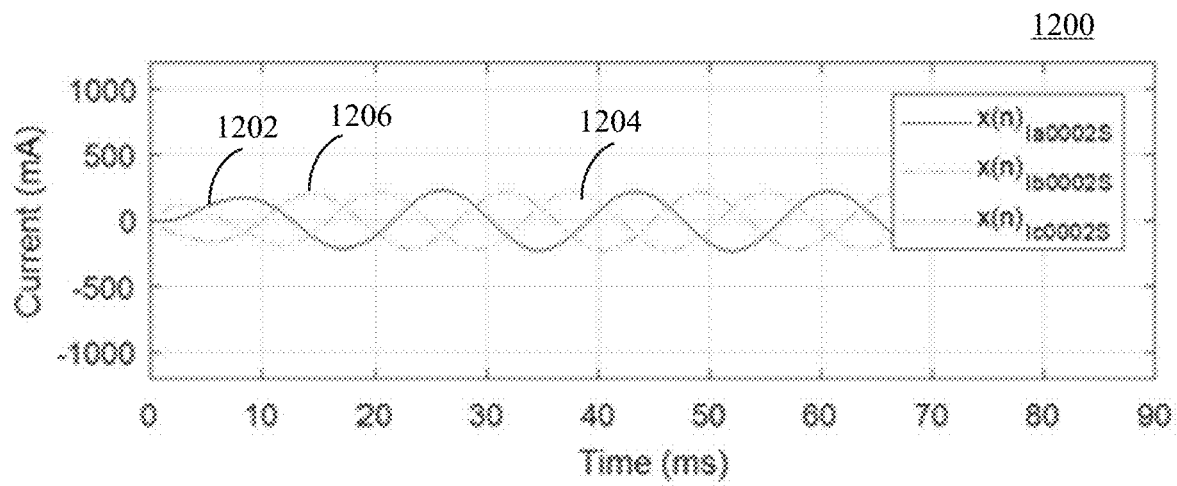
FIG. 12 is a plot of current signals after denoise filtering is applied.

FIG. 12 is a plot of current signals after the db6 denoising technique is applied to the original signals shown in FIG. 6. Thus, the current signals were filtered to remove the noise component by utilizing the adaptive data-driven denoising technique via soft thresholding based on db6 DWT level 3 of decomposition. The output of this prefiltering technique is denoted as $x(n)_{Ia0002S}$, $x(n)_{Ib0002S}$ and $x(n)_{Ic0002S}$, which are respectively labeled as 1202, 1204 and 1206 in FIG. 12. The db6 has 12 taps and practically removes most of the noise and smoothens the signal. As shown in FIG. 12, the noise contained in the current signals has been significantly removed, making the real-time detection of HIF much easier.

Figure 13:
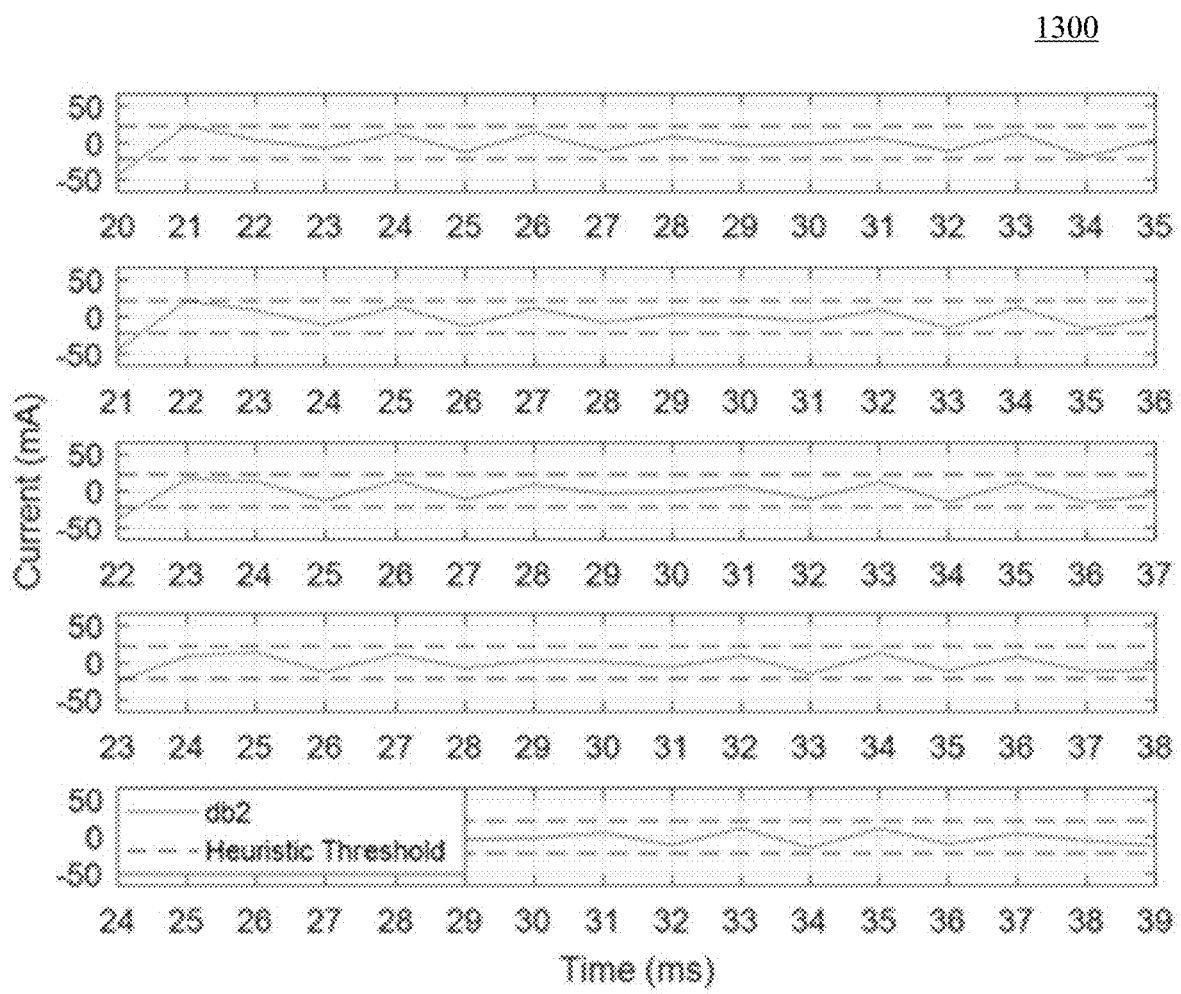
FIG. 13 is a plot of a detail reconstruction signal after denoise filtering.

FIG. 13 is a plot of a detail reconstruction signal after denoise filtering of the original input signal via db6 denoising. After denoise filtering, the db2 level 1 DWT is applied to the denoised current signal to detect the HIF with the threshold±22 mA. As seen in FIG. 13, each of the 16 output samples of the moving window shows that the amplitude of the output bins stays within the threshold boundaries. That is, there is no bin value that exceeds the upper bound of the threshold, and no bin value that is lower than the lower bound of the threshold. Hence, there is no false alarm reading. Since there is no HIF in this normal healthy dataset, it makes sense that no HIF is observed in the moving windows (i.e., the top frame to the bottom frame of FIG. 13) of the detail signal $z_{f1}(n)$, as shown in FIG. 13.

Accordingly, the prefiltering process is beneficial, and the db6 level 3 adaptive denoising technology yields the best result among the three prefiltering methods and is utilized in embodiments. However, db6 is a non-limiting example, other wavelets may be used for denoising the signal prior to HIF detection.

HIF Detection

Examples of the HIF detection technique with two faulty cases caused by a down energized conductor will be described in conjunction with subsequent figures. Using the heuristic threshold (±22 mA) determined in the pre-HIF analysis as described above, the HIF detection criteria are given as follows. If one or more output bin values of the detail reconstruction output are higher or lower than the predetermined heuristic threshold with polarity changes in two or more consecutive moving windows, then an HIF exists and is detected. Otherwise, it is healthy with no HIF.

Figure 14:
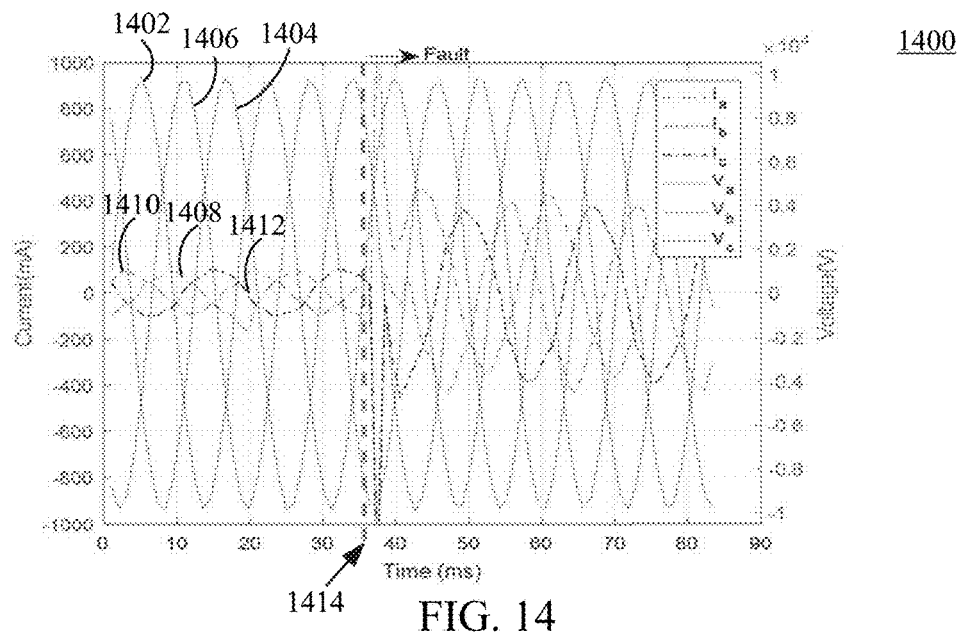
FIG. 14 is a plot of current and voltage signals with an HIF event at 35 millisecond.

The first faulty case includes a 60 Hz signal with a sampling frequency of 960 Hz. FIG. 14 is a plot of the three phases of the 60 Hz current and voltage signals with an HIF event occurring at 35 millisecond. In this case, the voltage signals $x(n)_{Va}$, $x(n)_{Vb}$, and $x(n)_{Vc}$, respectively labeled as 1402, 1404, and 1406 in FIG. 14 are clean and are not effected during the HIF occurrence. Therefore, they are not used to analyze or detect the HIF here. However, in other cases, they may be. In contrast, the current signals $x(n)_{Ia}$, $x(n)_{Ib}$ and $x(n)_{Ic}$, respectively labeled as 1408, 1410 and 1412 in FIG. 14, are utilized to perform noise reduction prior to the detection process. The HIF fault occurring at 35 millisecond is labeled as 1414 in FIG. 14.

A moving window is employed to detect the HIF in the time domain. Here, the window length is chosen to be 16 points, because it covers one complete signal cycle in each frame of the moving window (frequency ratio 60/960=1/16).

Figure 15:
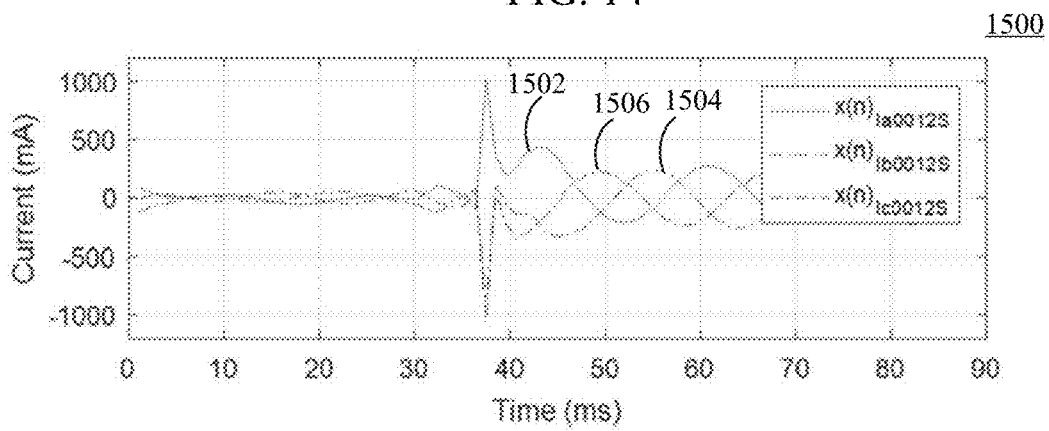
FIG. 15 is a plot of the current signals of FIG. 14 after denoising.

FIG. 15 is a plot of the current signals of FIG. 14 after denoising. First, the current signals $x(n)_{Ia}$, $x(n)_{Ib}$ and $x(n)_{Ic}$, are filtered to remove the noise by utilizing the adaptive data-driven denoising process via soft thresholding based on db6 level 3 decomposition. Second, the filtered signals are renamed as $x(n)_{Ia20012S}$, $x(n)_{Ib0012S}$ and $x(n)_{Ic0012S}$, respectively labeled as 1502, 1504 and 1506 in FIG. 15. As can be seen in FIG. 15, a significantly amount of the noise contained in the current signals has been removed.

Figure 16:
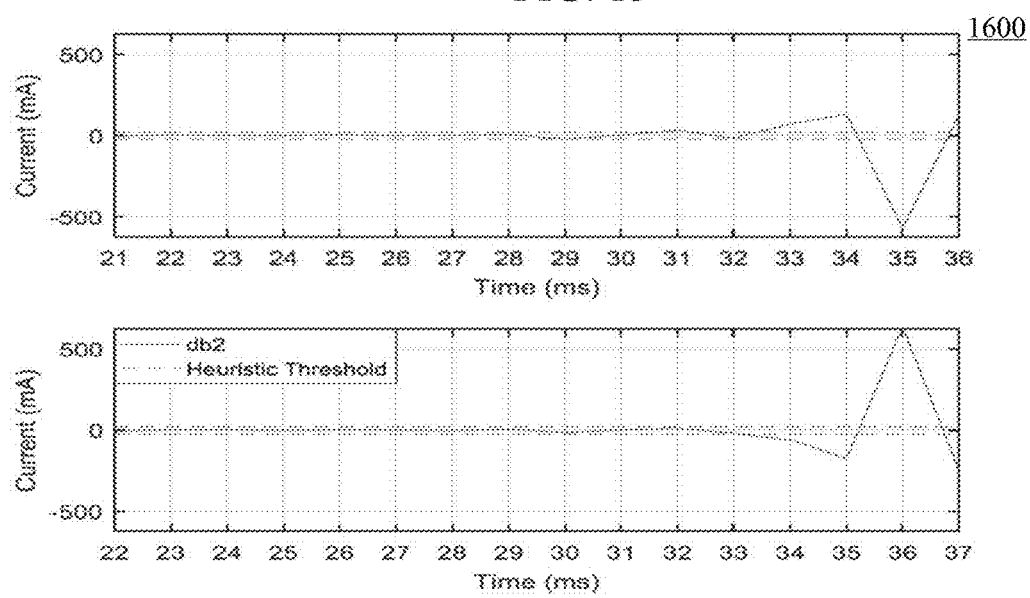
FIG. 16 depicts two consecutive moving windows for detecting an HIF event.

FIG. 16 depicts two consecutive moving windows for detecting the HIF event at 35 millisecond. After applying the db2 level 1 to the current signal $x(n)_{Ia20012S}$, the bin value of the $z_{f1}(n)$ signal sequence is shown in FIG. 16 in the top frame and bottom frame. Note that $x(n)_{Ia20012S}$ is selected as a non-limiting example, other current signals (e.g., $x(n)_{Ib20012S}$ or $x(n)_{Ic20012S}$) may also be selected, and would yield the same results. Since the denoising process via DWT db6 level 3 has been successful at removing a significant amount of noise, only db2 level 1 is needed in this step. Prior to the top frame, each 16-point moving window shows no false alarm readings. The HIF is correctly detected at the moving window frames shown in FIG. 16. Note that one or more output bin value of the detail reconstruction output sequence of both frames shown in FIG. 16 is higher or lower than the predetermined heuristic threshold with a polarity change from a negative value at 35 millisecond to a positive value at 36 millisecond. That is, in the top frame, there is a bin value that is below the lower bound of the threshold occurring at 35 millisecond, and in the bottom frame, there is a bin value that is above the upper bound of the threshold. Thus, the detail reconstruction output sequence has a negative value in the top frame and a positive value in the bottom frame, indicating a polarity change. Hence the event occurring at 35 millisecond meets the HIF criteria. This criteria requires a minimum of two consecutive frames (i.e., moving windows) for the fastest detection at the earliest time. This HIF event is detected in real-time corresponding to the time at 37 millisecond, the ending time of the bottom frame. The energized conductor drops on the testing pad gravel at 35 millisecond, which is the time the HIF is initiated. The two milliseconds time delay is due to the fact that it takes that long to collect the data to form two complete 16-point frames to process and then meet the HIF detection criteria.

Figure 17:
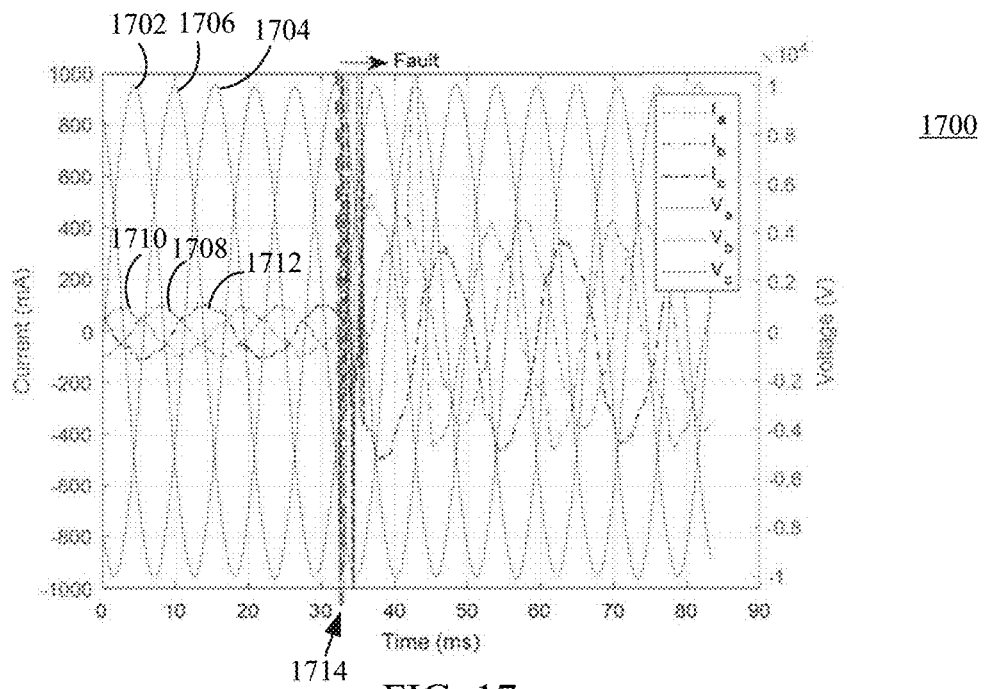
FIG. 17 is a plot of current and voltage signals with an HIF event at 32.7 millisecond.

In the second faulty case the sampling frequency is set to 5010 Hz. FIG. 17 is a plot of current signals and voltage signals with an HIF event initiated at 32.7 millisecond. In this case, the voltage signals $x(n)_{Va}$, $x(n)_{Vb}$, and $x(n)_{Vc}$, respectively labeled as 1702, 1704, and 1706 in FIG. 17 are clean and are not effected during the HIF occurrence. Therefore, they are not used to analyze or detect the HIF in this example, even though in other cases, they may be. In contrast, the current signals $x(n)_{Ia}$, $x(n)_{Ib}$ and $x(n)_{Ic}$, respectively labeled as 1708, 1710 and 1712 in FIG. 17, are utilized to perform noise reduction prior to the detection process.

Figure 18:
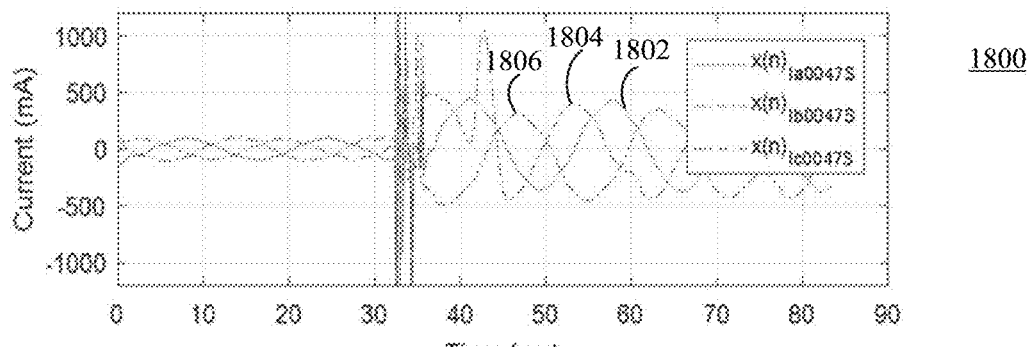
FIG. 18 is a plot of the current signals of FIG. 17 after denoising.

FIG. 18 is a plot of the current signals of FIG. 17 after denoising. The current signals $x(n)_{Ia}$, $x(n)_{Ib}$, and $x(n)_{Ic}$, shown in FIG. 17 are filtered to remove the noise by utilizing the adaptive data-driven denoising process via soft thresholding based on db6 level 3 decomposition. The filtered signals are renamed as $x(n)_{Ia20047S}$, $x(n)_{Ib0047S}$ and $x(n)_{Ic0047S}$, respectively labeled as 1802, 1804 and 1806 in FIG. 18. As can be seen in FIG. 18, denoising results in cleaner and smoother current signals.

Figure 19:
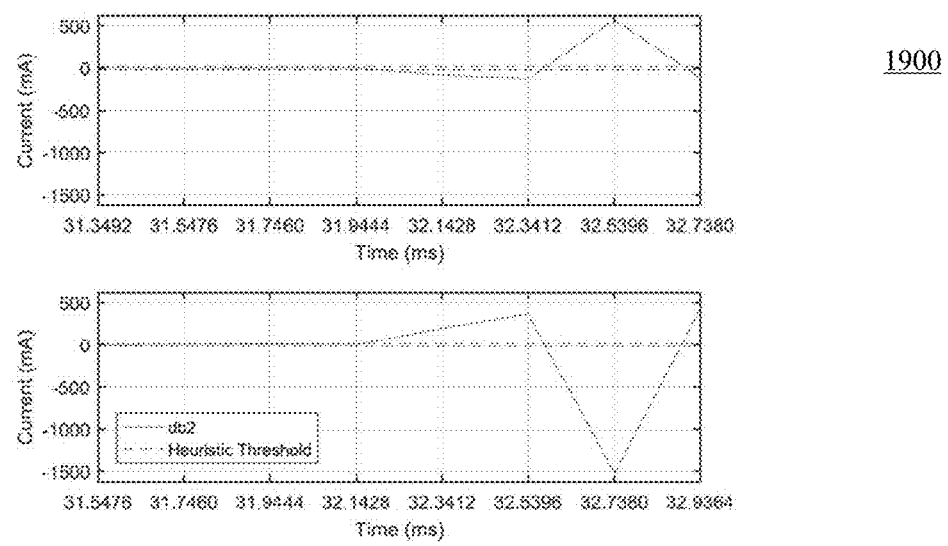
FIG. 19 is a plot of two consecutive moving windows for detecting the HIF event at 32.7 millisecond.

FIG. 19 is a plot of two consecutive moving windows for detecting the HIF event at 32.7 millisecond. FIG. 19 shows two 8-point moving frames, which offer a quicker HIF detection than in the first faulty case. This is due to the higher sampling rate and the shorter moving window length for processing the current signals. The HIF is correctly observed at the moving window top frame and bottom frame. One or more output bin value of the detail reconstruction output sequence of both frames is higher or lower than the predetermined heuristic threshold with a polarity change from a positive value at 32.5 millisecond to a negative value at 32.7 millisecond. Hence, it meets the detection criteria, and the HIF event occurring at 32.5 millisecond is detected at 32.9 millisecond, the ending time of the bottom frame. Here, the 0.4 milliseconds time delay is due to the data collection and processing time of two complete 8-point frames, and then the HIF event is declared.

These faulty cases provide examples that validate the efficacy of the HIF detection technique described herein, i.e., the db6 adaptive denoising technique in conjunction with moving window db2 HIF detection, and are intended to be non-limiting. These cases demonstrate that an HIF event may be detected in real-time, without delay except for data collection and processing time. The HIF events occur in a fraction of a second with a small current change, close to 0 A, making them difficult for conventional protection relay to detect. However, the HIF detection technique described herein is able to detect the HIF events, declare them as such, and issue the trip or no-trip decision. This may prompt service crew members to be sent out immediately to prevent harm due to any hazardous conditions, especially arcing on dry grass.

Example Computer System Implementation

Each of HIF detection system 106 and HIF detection system 500, and flowchart 200 may be implemented in hardware, or hardware combined with software and/or firmware. For example, HIF detection system 106 and HIF detection system 500, and flowchart 200 may be implemented as computer program code/instructions configured to be executed in one or more processors and stored in a computer readable storage medium. Alternatively, HIF detection system 106 and HIF detection system 500, and flowchart 200 may be implemented as hardware logic/electrical circuitry.

For instance, in an embodiment, one or more, in any combination, of HIF detection system 106 and HIF detection system 500 may be implemented together in a system-on-a-chip (SoC). The SoC may include an integrated circuit that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 20:
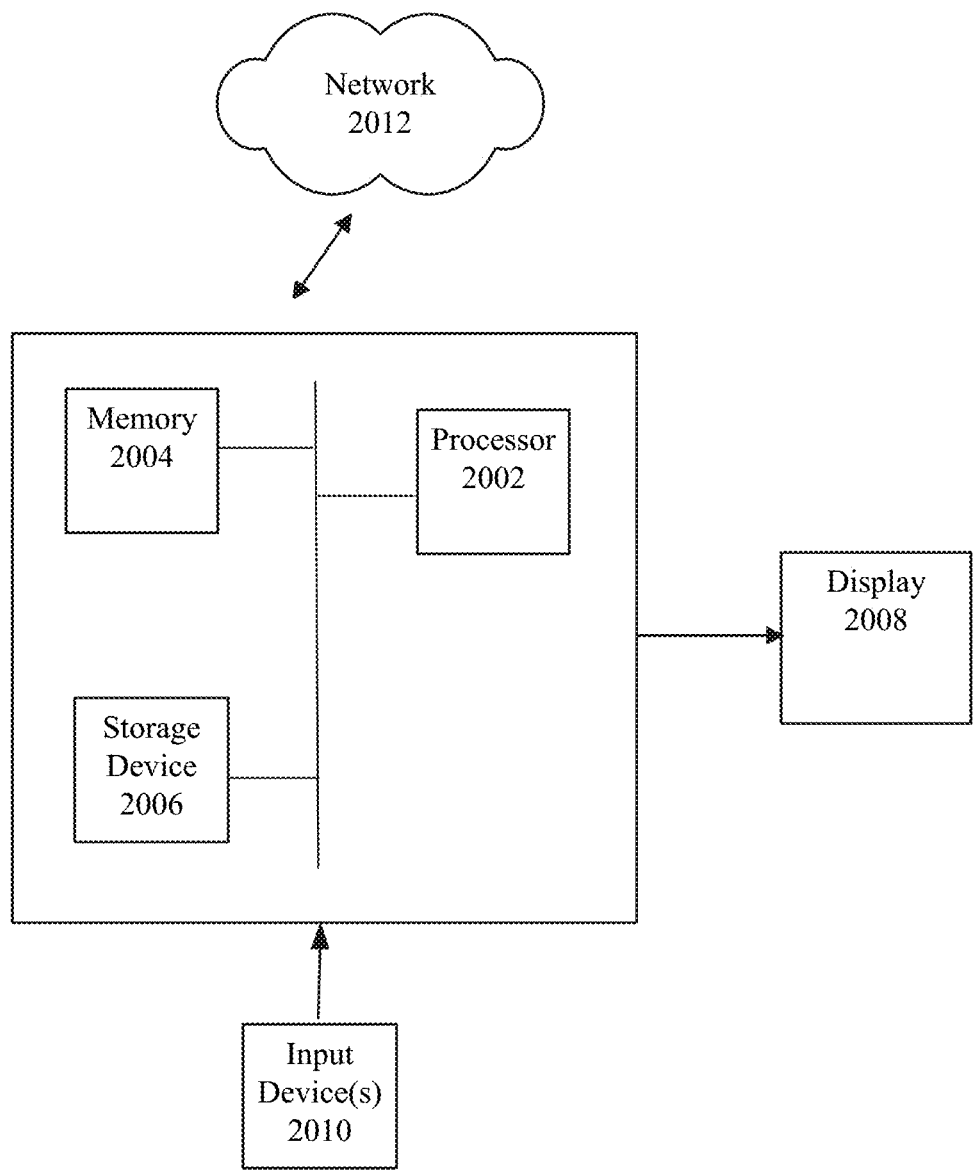
FIG. 20 is a block diagram of an example computer system in which embodiments may be implemented.

FIG. 20 is a block diagram of an example computer system in which embodiments may be implemented. The description of computing device 2000 is provided for purposes of illustration, and is not intended to be limiting. Embodiments may be implemented in further types of computer systems, as would be known to persons skilled in the relevant art(s).

As shown in FIG. 20, computing device 2000 includes processor 2002, memory 2004, and storage device 2006. These components may be coupled together via a bus.

Processor 2002 may be referred to as a processor circuit or a processing unit. Processor 2002 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor 2002 may execute program code stored in a computer readable medium, such as program code of an operating system, an application program, and other programs.

Memory 2004 includes any system memory, for example, read only memory (ROM) and random access memory (RAM) and may store a basic input/output system (e.g., BIOS).

Storage device 2006 may include any of a hard disk drive, a magnetic disk drive, an optical disk drive, a removable optical disk (e.g., CD ROM, DVD ROM), a flash memory card, a digital video disk, RAMs, ROMs, or other hardware storage media. Storage device 2006 and its associated computer readable media provide nonvolatile storage of computer-readable instructions, data structures, program modules and other data for computing device 2000.

A number of program modules may be stored on memory 2004 and/or storage device 2006. These programs include an operating system, an application program, other programs, and program data. Such an application program or other programs may include, for example, computer program logic (e.g., computer program code or instructions) for implementing system components and/or embodiments described herein.

A user may enter commands and information into the computing device 2000 through input devices 2010 such as a keyboard and a pointing device. Other input devices (not shown) may include a microphone, joystick, game pad, satellite dish, scanner, touch screen and/or touch pad, voice recognition system to receive voice input, gesture recognition system to receive gesture input, or the like. These and other input devices are often connected to processor 2002 through a serial port interface that is coupled to the bus, but may be connected by other interfaces, such as a parallel port, game port, or a universal serial bus (USB).

A display 2008 is also connected to the bus via an interface, such as a video adapter. Display 2008 may be external to, or incorporated in computing device 2000. Display 2008 may display information, as well as being a user interface for receiving user commands and/or other information (e.g., by touch, finger gestures, virtual keyboard, etc.). In addition to display 2008, computing device 2000 may include other peripheral output devices (not shown) such as speakers and printers.

Computing device 2000 is connected to a network 2012 (e.g., the Internet) through an adaptor or network interface, a modem, or other means for establishing communications over the network.

As used herein, the terms "computer program medium," "computer-readable medium," and "computer-readable storage medium" are used to refer to physical hardware media such as the hard disk associated with storage device 2006. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

CONCLUSION

While various embodiments of the disclosed subject matter have been described above, it should be understood that they have been presented by way of example only, and not limitation. Various modifications and variations are possible without departing from the spirit and scope of the embodiments as defined in the appended claims. Accordingly, the breadth and scope of the disclosed subject matter should not be limited by any of the above-described exemplary embodiments, but should be defined only in accordance with the following claims and their equivalents.

What is claimed is:

1. A method for real-time detection of high-impedance faults in a distribution circuit, comprising:
    obtaining an input signal from a device connected to the distribution circuit;
    filtering the input signal using discrete wavelet transform via a first orthogonal wavelet to generate a denoised signal;
    determining a threshold having an upper bound and a lower bound;
    decomposing the denoised signal using discrete wavelet transform via a second orthogonal wavelet to generate a decomposed signal;
    synthesizing a detail signal based on the decomposed signal;
    comparing the detail signal to the threshold; and
    based on the comparing, generating a trip or no-trip decision for a high-impedance fault detection device.

2. The method of claim 1, further comprising:
    selecting a moving window length for the input signal.

3. The method of claim 1, wherein the input signal comprises at least one of a current signal or a voltage signal.

4. The method of claim 1, further comprising:
    placing the input signal in an instrumentation appropriate format prior to filtering the input signal.

5. The method of claim 1, wherein the first orthogonal wavelet comprises a first Daubechies wavelet, and the second orthogonal wavelet comprises a second Daubechies wavelet that is different from the first Daubechies wavelet.

6. The method of claim 1, wherein the threshold is based on a healthy dataset without high-impedance faults during normal operation of the distribution circuit.

7. The method of claim 1, wherein the generating a trip or no-trip decision for a high-impedance fault detection device comprises:
    generating a trip decision indicating detection of a high-impedance fault when
        the detail signal is higher than the upper bound of the threshold in a first moving time window, and the detail signal is lower than the lower bound of the threshold in a second consecutive moving time window, or
        the detail signal is lower than the lower bound of the threshold in a first moving time window, and the detail signal is higher than the upper bound of the threshold in the second consecutive moving time window.

8. The method of claim 1, wherein the generating the trip or no-trip decision for the high-impedance fault detection device comprises:
    generating a no-trip decision indicating no detection of a high-impedance fault when the detail signal is within the upper bound and the lower bound of the threshold.

9. A system for real-time detection of high-impedance faults in a distribution circuit, comprising:
    a signal sensor configured to obtain an input signal from the distribution circuit;
    a filter configured to denoise the input signal using discrete wavelet transformation via a first orthogonal wavelet to generate a denoised signal;
    a threshold determiner configured to determine a threshold having an upper bound and a lower bound;
    a signal analyzer configured to decompose the denoised signal using discrete wavelet transform via a second orthogonal wavelet to generate a decomposed signal;
    a signal synthesizer configured to synthesize a detail signal based on the decomposed signal; and
    a detector configured to compare the detail signal to the threshold and generate a trip or no-trip decision for a high-impedance fault detection device.

10. The system of claim 9, further comprising a window length selector for selecting a moving window length for the input signal.

11. The system of claim 9, wherein the device comprises at least one of a voltage sensor or a current sensor.

12. The system of claim 9, further comprising a control apparatus configured to place the input signal in an instrumentation appropriate format prior to filtering the input signal.

13. The system of claim 9, wherein the first orthogonal wavelet comprises a first Daubechies wavelet, and the second orthogonal wavelet comprises a second Daubechies wavelet that is different from the first Daubechies wavelet.

14. The system of claim 9, wherein the threshold is based on a healthy dataset without a high-impedance fault during normal operation of the distribution circuit.

15. The system of claim 9, wherein the detector is further configured to generate a trip decision indicating detection of a high-impedance fault when
    the detail signal is higher than the upper bound of the threshold in a first moving time window, and the detail signal is lower than the lower bound of the threshold in a second consecutive moving time window, or
    the detail signal is lower than the lower bound of the threshold in a first moving time window, and the detail signal is higher than the higher bound of the threshold in a second consecutive moving time window.

16. The system of claim 9, wherein the detector is further configured to generate a no-trip decision indicating no detection of a high-impedance fault when the detail signal is within the upper bound and the lower bound of the threshold.

17. A system, comprising:
    a processor; and
    a memory that stores computer program logic for execution by the processor, the computer program logic including:
        a filter configured to denoise an input signal using discrete wavelet transformation via a first orthogonal wavelet to generate a denoised signal;

a threshold determiner configured to determine a threshold having an upper bound and a lower bound;

a signal analyzer configured to decompose the denoised signal using discrete wavelet transform via a second orthogonal wavelet to generate a decomposed signal;

a signal synthesizer configured to synthesize a detail signal based on the decomposed signal; and a detector configured to compare the detail signal to the threshold and generate a trip or no-trip decision for a high-impedance fault detection device.

18. The system of claim 17, wherein the first orthogonal wavelet comprises a first Daubechies wavelet, and the second orthogonal wavelet comprises a second Daubechies wavelet that is different from the first Daubechies wavelet.

19. The system of claim 17, wherein the detector is further configured to generate a trip decision when the detail signal is higher than the upper bound of the threshold in a first moving time window, and the detail signal is lower than the lower bound of the threshold in a second consecutive moving time window, or the detail signal is lower than the lower bound of the threshold in a first moving time window, and the detail signal is higher than the upper bound of the threshold in the second consecutive moving time window.

20. The system of claim 17, wherein the detector is further configured to generate a no-trip decision when detail signal is within the upper bound and the lower bound of the threshold.

\* \* \* \* \*